US010424513B2

(12) United States Patent
Park et al.

(10) Patent No.: US 10,424,513 B2
(45) Date of Patent: Sep. 24, 2019

(54) SEMICONDUCTOR DEVICE

(71) Applicant: Samsung Electronics Co., Ltd., Suwon-si, Gyeonggi-do (KR)

(72) Inventors: Jung Il Park, Gwacheon-si (KR); Jeong Hoon Ahn, Yongin-si (KR); Joon-Nyung Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/005,886

(22) Filed: Jun. 12, 2018

(65) Prior Publication Data

US 2019/0157150 A1 May 23, 2019

(30) Foreign Application Priority Data

Nov. 22, 2017 (KR) .................. 10-2017-0156422

(51) Int. Cl.
*H01L 21/78* (2006.01)
*H01L 21/768* (2006.01)
*H01L 23/528* (2006.01)
*H01L 23/00* (2006.01)
*H01L 23/58* (2006.01)

(52) U.S. Cl.
CPC ........ *H01L 21/78* (2013.01); *H01L 21/76811* (2013.01); *H01L 21/76816* (2013.01); *H01L 23/5283* (2013.01); *H01L 23/562* (2013.01); *H01L 23/564* (2013.01); *H01L 23/585* (2013.01)

(58) Field of Classification Search
CPC ............. H01L 21/78; H01L 21/76811; H01L 21/76816; H01L 23/5283; H01L 23/562; H01L 23/564; H01L 23/585
See application file for complete search history.

(56) References Cited

U.S. PATENT DOCUMENTS

| 6,815,820 | B2 | 11/2004 | Yu et al. |
| 7,648,920 | B2 | 1/2010 | Arakawa |
| 8,008,750 | B2 | 8/2011 | Kaltalioglu et al. |
| 8,383,512 | B2 * | 2/2013 | Chen ............... H01L 23/50 257/E21.159 |
| 8,434,033 | B2 | 4/2013 | Abou Ghaida et al. |

(Continued)

FOREIGN PATENT DOCUMENTS

KR 10-1153225 B1 6/2012

*Primary Examiner* — Fernando L Toledo
*Assistant Examiner* — Neil R Prasad
(74) *Attorney, Agent, or Firm* — Harness, Dickey & Pierce, P.L.C.

(57) ABSTRACT

A semiconductor device, comprising: a substrate which includes an active circuit region, and a boundary region surrounding the active circuit region, the boundary region including an edge portion of the substrate; a first lower conductive pattern disposed on the substrate of the boundary region; and a first upper conductive pattern connected to the first lower conductive pattern over the first lower conductive pattern, wherein the first upper conductive pattern includes a first portion having a first thickness, a second portion having a second thickness greater than the first thickness, and a third portion having a third thickness greater than the second thickness, and the third portion of the first upper conductive pattern is connected to the first lower conductive pattern, is provided.

15 Claims, 23 Drawing Sheets

(56) References Cited

U.S. PATENT DOCUMENTS

| | | |
|---|---|---|
| 8,719,757 B2 | 5/2014 | Yuan et al. |
| 9,098,670 B2 | 8/2015 | Song et al. |
| 9,342,646 B2 | 5/2016 | Yu-Tseng et al. |
| 9,355,893 B1 | 5/2016 | Chen et al. |
| 9,384,307 B2 | 7/2016 | Hsu et al. |
| 9,443,911 B2 | 9/2016 | Ha |
| 9,530,689 B2 | 12/2016 | Civay et al. |
| 9,543,192 B2 | 1/2017 | Shao et al. |
| 9,679,804 B1 | 6/2017 | Chen et al. |
| 2003/0209779 A1* | 11/2003 | Yu .................... H01L 21/76807 257/533 |
| 2012/0210279 A1 | 8/2012 | Hsu et al. |
| 2014/0353820 A1 | 12/2014 | Yu et al. |
| 2014/0361438 A1* | 12/2014 | Zeng .................... H01L 23/585 257/774 |
| 2015/0097249 A1 | 4/2015 | Kim et al. |
| 2015/0357293 A1* | 12/2015 | Tomita ................ H01L 23/5283 257/629 |
| 2016/0049509 A1 | 2/2016 | Tomita |
| 2016/0070838 A1 | 3/2016 | Kang et al. |
| 2016/0306914 A1 | 10/2016 | Kang et al. |
| 2016/0379891 A1 | 12/2016 | Park et al. |
| 2017/0125396 A1 | 5/2017 | Shao et al. |
| 2017/0194248 A1* | 7/2017 | Das ....................... H01L 23/481 |

\* cited by examiner

SEMICONDUCTOR DEVICE

This application claims priority to Korean Patent Application No. 10-2017-0156422, filed on Nov. 22, 2017, and all the benefits accruing therefrom under 35 U.S.C. § 119, the disclosure of which is incorporated herein by reference in its entirety.

BACKGROUND

1. Field of the Inventive Concept

The present inventive concepts relate to a semiconductor device, and more specifically, to a semiconductor device including a guide structure which reduces and/or prevents cracks and/or moisture.

2. Description of the Related Art

An integrated circuit is a group of electronic circuits on a semiconductor material, which is generally silicon. Semiconductor integrated circuits are manufactured in a front-end process including a photo process, a deposition process and an etching process, which are supplemented by doping and cleaning. Once the front-end process is completed, wafers are prepared for testing and packaging.

Many different packaging techniques have been developed, including wafer-level packaging technique. The wafer-level packaging techniques are completed in the form of a wafer, and after the wafer is diced, each semiconductor chip die is completed.

When dicing of the wafer is performed, chipping, delamination, or micro-cracking may occur, which may cause adverse influences on the integrated circuits in the semiconductor chip die. Also, when moisture permeates through the boundary portion of the semiconductor chip die, adverse effects may be caused on the integrated circuit in the semiconductor chip die.

SUMMARY

An aspect of the present inventive concepts provides a semiconductor device capable of improving reliability of an element through a guide structure formed along a boundary region of a semiconductor chip.

Another aspect of the present inventive concepts provides a method for manufacturing a semiconductor device capable of improving the performance of an element, by reducing the resistance of wiring, using a metal stitch structure which indicates a structure having different thickness of the wiring in the same level.

According to some example embodiments of the present inventive concepts, a semiconductor device, comprising: a substrate which includes an active circuit region, and a boundary region surrounding the active circuit region, the boundary region including an edge portion of the substrate; a first lower conductive pattern disposed on the substrate of the boundary region; and a first upper conductive pattern connected to the first lower conductive pattern over the first lower conductive pattern, wherein the first upper conductive pattern includes a first portion having a first thickness, a second portion having a second thickness greater than the first thickness, and a third portion having a third thickness greater than the second thickness, and the third portion of the first upper conductive pattern is connected to the first lower conductive pattern, is provided.

According to some example embodiments of the present inventive concepts, a semiconductor device, comprising: a substrate including an active circuit region, and a boundary region surrounding the active circuit region; a first fin type pattern disposed on the substrate of the active circuit region; a gate electrode on the first fin type pattern; a pre-metal insulating layer on the first fin type pattern and the gate electrode; a first lower conductive pattern and a second lower conductive pattern disposed at a first metal level on the pre-metal insulating layer and spaced apart from each other, in the boundary region; a first upper conductive pattern disposed at a second metal level higher than the first metal level and connected to the first lower conductive pattern; and a second upper conductive pattern disposed at the second metal level, spaced apart from the first upper conductive pattern, and connected to the second lower conductive pattern, wherein the first upper conductive pattern includes a first portion having a first thickness, a second portion having a second thickness greater than the first thickness, and a third portion having a third thickness greater than the second thickness, and the first portion of the first upper conductive pattern is disposed between the second portion of the first upper conductive pattern and the third portion of the first upper conductive pattern, is provided.

According to some example embodiments of the present inventive concepts, a semiconductor device, comprising: a substrate which includes an active circuit region, and a boundary region surrounding the active circuit region, the boundary region including an edge portion of the substrate; and a first conductive guard structure surrounding the active circuit region on the substrate of the boundary region, wherein the first conductive guard structure includes a first plate pattern, a second plate pattern on the first plate pattern, and a via pattern for connecting the first plate pattern and the second plate pattern, the second plate pattern is spaced apart from the first plate pattern, wherein the second plate pattern includes a first portion having a first thickness, and a second portion having a second thickness greater than the first thickness is provided.

According to some example embodiments of the present inventive concepts, a method for manufacturing a semiconductor device, the method comprising: forming an interlayer insulating film on a substrate; forming a hard mask film in the interlayer insulating film; forming a first trench including a first portion and a second portion, in the hard mask film, forming a mask pattern which exposes the first portion of the first trench; forming a second trench in the hard mask film, using the mask pattern to form a pattern trench in the hard mask film; forming a hard mask pattern to expose the interlayer insulating film which overlaps the pattern trench by etching the hard mask film to expose the interlayer insulating film which overlaps the pattern trench; and forming a wiring trench in the interlayer insulating film by etching the interlayer insulating film using the hard mask pattern to form a wiring trench in the interlayer insulating film, wherein a depth of the wiring trench at a position corresponding to the second trench is deeper than a depth of the position of the wiring trench at a position corresponding to the second portion of the first trench, is provided.

However, aspects of the present inventive concepts are not restricted to the ones set forth herein. The above and other aspects of the present inventive concepts will become more apparent to one of ordinary skill in the art to which the present inventive concepts pertain by referencing the detailed description of the present inventive concepts given below.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION OF EXAMPLE EMBODIMENTS

Figure 1:
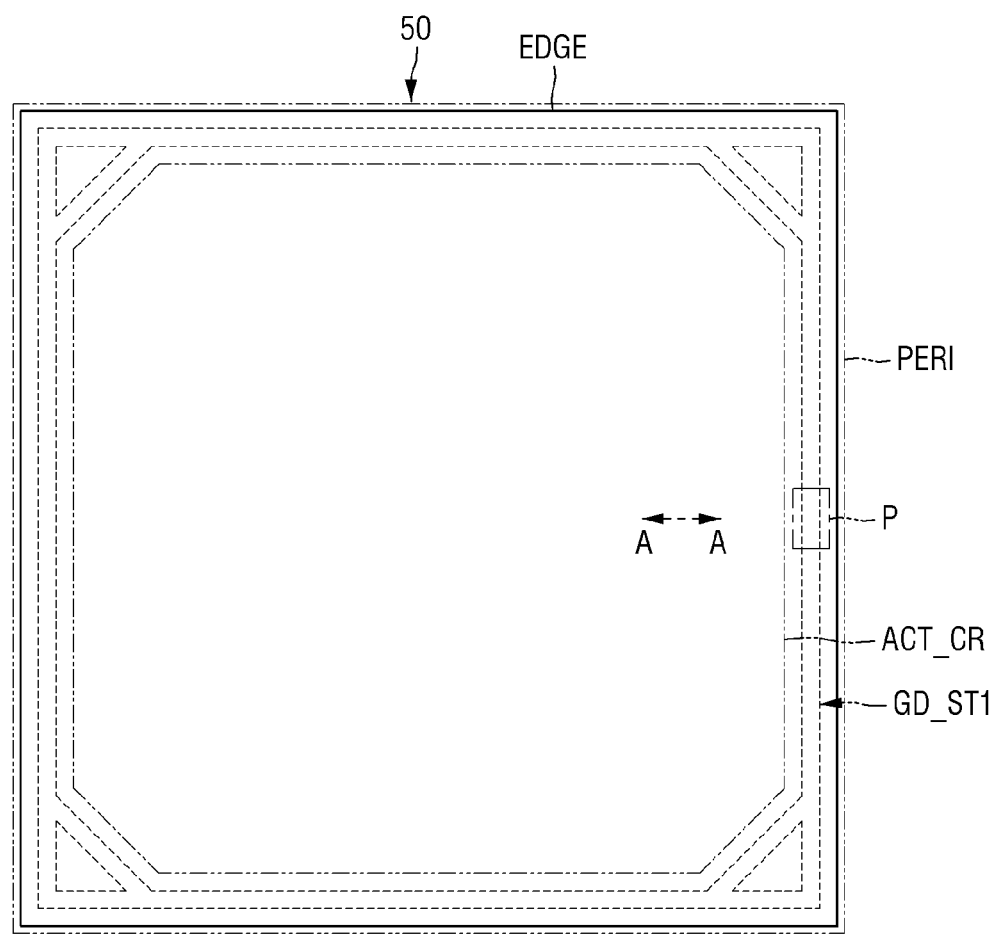
FIG. 1 is a plan view for explaining a semiconductor device according to some example embodiments of the present inventive concepts.

In the drawings of the semiconductor device according to some example embodiments of the present inventive concepts, a fin type transistor (FinFET) including a channel region of a fin type pattern shape is exemplarily illustrated, but the present inventive concepts are not limited thereto. The semiconductor device according to some example embodiments of the present inventive concepts may include a tunneling FET, a transistor including a nanowire, a transistor including a nanosheet, or a three-dimensional (3D) transistor. The semiconductor device according to some example embodiments of the present inventive concepts may include a planar transistor.

Figure 2:
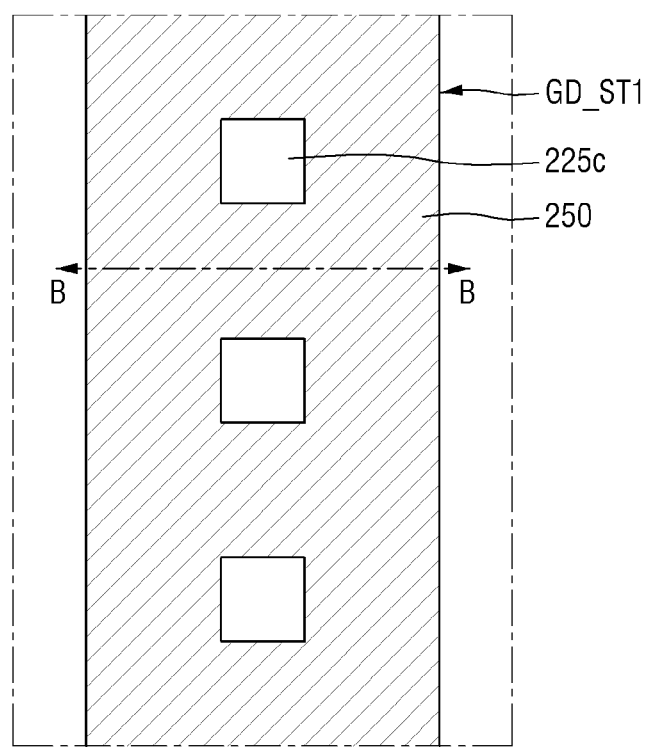
FIG. 2 is an enlarged view of a region P of FIG. 1.
Figure 3:
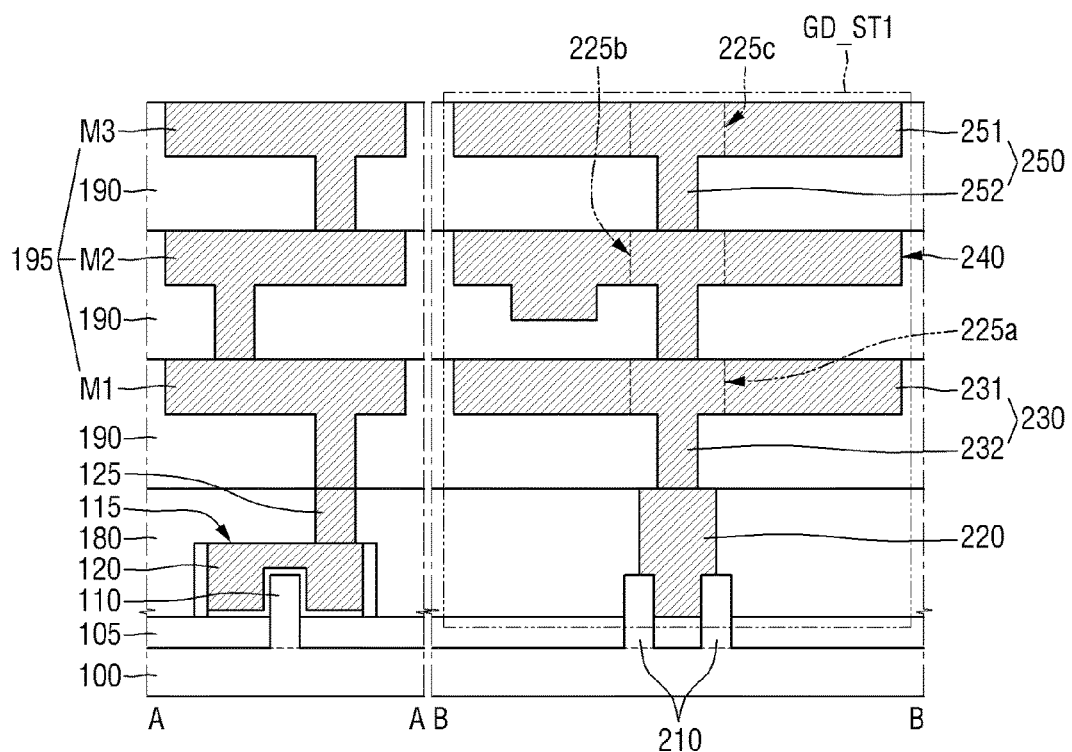
FIG. 3 is a cross-sectional view taken along the line A-A of FIG. 1 and the line B-B of FIG. 2.
Figure 4:
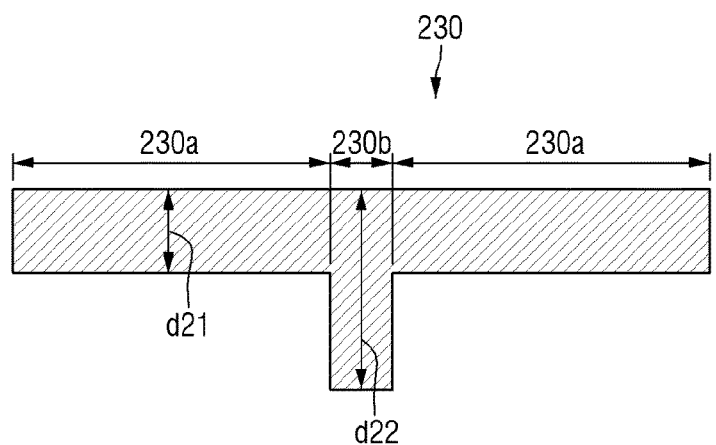
FIG. 4 is a diagram for explaining a first outer conductive pattern of FIG. 3.
Figure 5:
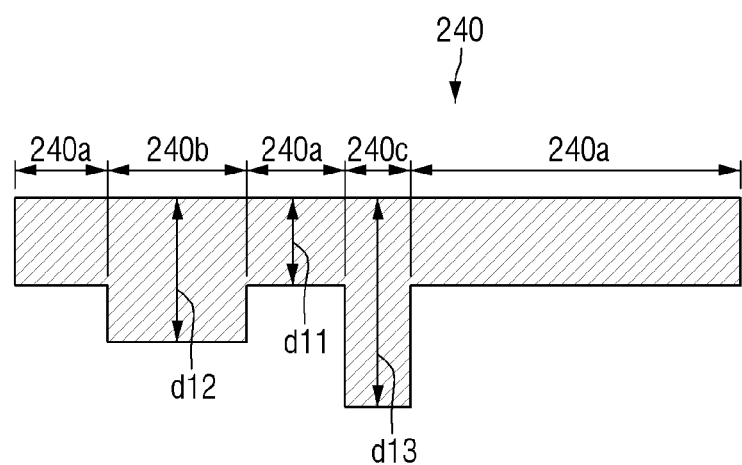
FIGS. 5 and 6 are diagrams for explaining a second outer conductive pattern of FIG. 3.
Figure 6:
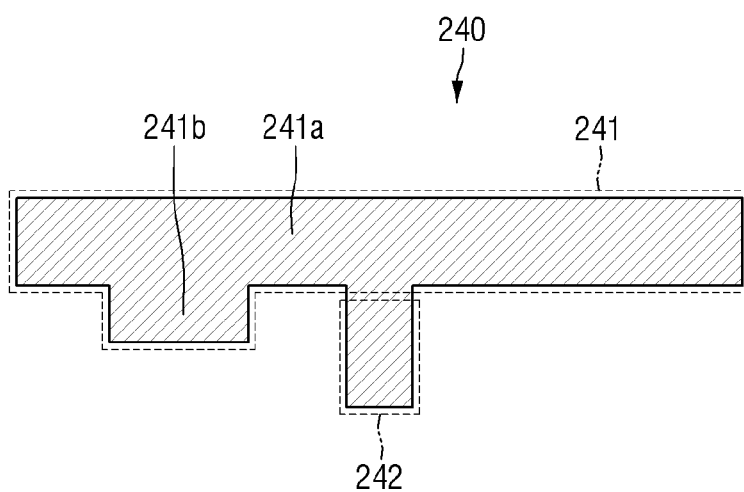

FIG. 1 is a plan view for explaining the semiconductor device according to some example embodiments of the present inventive concepts. FIG. 2 is an enlarged view of a region P of FIG. 1. FIG. 3 is a cross-sectional view taken along the line A-A of FIG. 1 and the line B-B of FIG. 2. FIG. 4 is a diagram for explaining the first outer conductive pattern of FIG. 3. FIGS. 5 and 6 are diagrams for explaining the second outer conductive pattern of FIG. 3, respectively.

For reference, FIGS. 2 and 3 illustrate a configuration in which a first interlayer insulating film does not cover an uppermost wiring layer and/or an upper surface of the outer conductive pattern.

Referring to FIGS. 1 to 5, a semiconductor device 50 according to some example embodiments of the present inventive concepts may include a substrate 100, and a first conductive guard structure (GD_ST1) on the substrate 100.

The substrate 100 may include an active circuit region (ACT_CR) and a boundary region (PERI). The boundary region (PERI) may surround the active circuit region (ACT_CR).

In the active circuit region (ACT_CR), an internal circuit including one or more transistors or the like may be formed. The internal circuit may include, but is not limited to, for example, a decoder, an arithmetic circuit, an input/output circuit, a memory circuit, and the like.

The boundary region (PERI) may include an edge portion (EDGE) of the substrate 100. The edge portion (EDGE) of the substrate 100 may be included at the edge of the semiconductor device 50. The edge of the semiconductor device 50 may be formed in a process of separating a large number of semiconductor devices on a semiconductor wafer. For example, after a large number of semiconductor devices are collectively manufactured on the semiconductor wafer, in the process of cutting the semiconductor wafer through a wafer cutting process to separate the semiconductor wafer into individual semiconductor devices 50, the edge of the semiconductor device 50 and the edge portion (EDGE) of the substrate 100 may be formed.

For example, the semiconductor device 50 may be a semiconductor die or a semiconductor chip.

The substrate 100 may be bulk silicon or silicon-on-insulator (SOI). Alternatively, the substrate 100 may be a silicon substrate or may include, but is not limited to, other material such as silicon germanium, silicon germanium on insulator (SGOI), indium antimonide, lead tellurium compound, indium arsenide, phosphide indium, gallium arsenide, or gallium antimonide.

The first conductive guard structure (GD_ST1) may be formed in the boundary region (PERI) of the substrate 100. The first conductive guard structure (GD_ST1) may be formed along the boundary region (PERI). In order to protect the internal circuit formed in the active circuit region (ACT_CR), the first conductive guard structure (GD_ST1) may be disposed to surround the active circuit region (ACT_CR).

In the wafer cutting process of separating the large number of semiconductor devices on the semiconductor wafer, the wafer is cut, using a cutting blade or a laser. At the time of the wafer cutting, cracks may be generated in the insulating layer between the metals forming the semiconductor device 50. The generated cracks may spread from the edge of the semiconductor device 50 to the active circuit region (ACT_CR).

Further, moisture may permeate through the cutting surface of the insulating layer between the metals, and may damage the internal circuit formed in the active circuit region (ACT_CR). Due to the permeated moisture, the internal circuit formed in the active circuit region (ACT_CR) may be oxidized.

The first conductive guard structure (GD_ST1) may reduce and/or prevent cracks spreading to the active circuit region (ACT_CR) or moisture penetrating into the active circuit region (ACT_CR).

The first conductive guard structure (GD_ST1) may include a moisture oxidation barrier structure and/or a crack stop structure surrounding the internal circuit formed in the active circuit region (ACT_CR).

The first conductive guard structure (GD_ST1) may reduce and/or prevent spread of cracks generated at the time of cutting the semiconductor wafer. Further, the first conductive guard structure (GD_ST1) may reduce and/or prevent the internal circuit from being oxidized due to permeation of moisture and/or air from the outside.

In FIG. 1, the first conductive guard structure (GD_ST1) is illustrated to have a shape in which a polygonal ring with chamfered corners and a square ring are coupled, but the inventive concepts are not limited thereto.

The first fin type pattern 110 and the gate structure 115 may be formed in the active circuit region (ACT_CR). The gate structure 115 may include a gate electrode 120.

The first fin type pattern 110 may be used as the channel region of the transistor. The gate electrode 120 may be used as a gate of the transistor. A transistor including the first fin type pattern 110 and the gate electrode 120 may be included in the internal circuit formed in the active circuit region (ACT_CR).

The first fin type pattern 110 may be disposed on the substrate 100 of the active circuit region (ACT_CR). The first fin type pattern 110 may extend in a first direction (X). The field insulating film 105 may cover a part of the side walls of the first fin type pattern 110. The first fin type pattern 110 may protrude upward from the upper surface of the field insulating film 105. The first fin type pattern 110 may be a part of the substrate 100, and may include an epitaxial layer that is grown from the substrate 100. The first fin type pattern 110 may include, for example, silicon or germanium which is a semiconductor material. In addition, the first fin type pattern 110 may include a compound semiconductor, and may include, for example, a group IV-IV compound semiconductor or a group III-V compound semiconductor.

The gate electrode 120 may be formed on the first fin type pattern 110. The gate electrode 120 may extend in a second direction (Y). The gate electrode 120 may include a conductive material.

A pre-metal insulating layer 180 may be formed over the active circuit region (ACT_CR) and the boundary region (PERI). The pre-metal insulating layer 180 may be formed on the first fin type pattern 110 and the gate electrode 120. The pre-metal insulating layer 180 may cover the upper surface of the gate electrode 120.

The wiring structure 195 may be formed on the substrate 100 of the active circuit region (ACT_CR). The wiring structure 195 may be connected to, for example, the gate electrode 120.

The wiring structure 195 may include a first wiring layer (M1), a second wiring layer (M2), and a third wiring layer (M3) sequentially formed on the pre-metal insulating layer 180. The second wiring layer (M2) may be formed on the first wiring layer (M1) and may be formed below the third wiring layer (M3). The first wiring layer (M1) may be formed at a first metal level. The second wiring layer (M2) may be formed at a second metal level higher (from the substrate 100) than the first metal level, and the third wiring layer (M3) may be formed at a third metal level higher (from the substrate 100) than the second metal level. The wiring structure 195 may be formed in the first interlayer insulating film 190 disposed on the pre-metal insulating layer 180.

The second wiring layer (M2) formed at the second metal level may be connected to the first wiring layer (M1) formed at the first metal level and the third wiring layer (M3) formed at the third metal level.

Although the wiring structure 195 is illustrated as including the first to third wiring layers (M1, M2, and M3), it is for convenience of explanation, and the inventive concepts are not limited thereto. The wiring structure 195 may include two or fewer wiring layers, and may include four or more wiring layers.

The connection wiring plug 125 may connect the gate electrode 120 and the wiring structure 195. The connection wiring plug 125 may be formed in the pre-metal insulating layer 180.

Each of the connection wiring plug 125 and the wiring structure 195 may include at least one of, for example, tantalum (Ta), tantalum nitride (TaN), titanium (Ti), titanium nitride (TiN), tungsten nitride (WN), tungsten carbonitride (WCN), tungsten (W), cobalt (Co), ruthenium (Ru), molybdenum (Mo), nickel (Ni), aluminum (Al), copper (Cu), gold (Au), silver (Au), and doped polysilicon.

Each of the pre-metal insulating layer 180 and the first interlayer insulating film 190 may include at least one of, for example, silicon oxide, silicon nitride, silicon oxynitride, organic-silicate glass, an organic material, an inorganic material, a low-dielectric constant material or an ultra low-dielectric constant material. The low-dielectric constant material may mean a material having a dielectric constant of less than 4. The ultra low-dielectric constant material may mean a material having a dielectric constant of less than 2.5. Each of the pre-metal insulating layer 180 and the first interlayer insulating film 190 may be porous material or non-porous material.

The first conductive guard structure (GD_ST1) may be formed on the substrate 100 of the boundary region (PERI). The first conductive guard structure (GD_ST1) may include a pair of second fin type patterns 210, a first outer conductive pattern 230, a second outer conductive pattern 240, and/or a third outer conductive pattern 250.

The second fin type pattern 210 may be disposed on the substrate 100 of the boundary region (PERI). Although the second fin type pattern 210 is illustrated to extend in the first direction (X), it is for convenience of explanation, and the inventive concepts are not limited thereto.

The field insulating film 105 may cover a part of the sidewalls of the second fin type pattern 210. The second fin type pattern 210 may protrude upward from the upper surface of the field insulating film 105. The second fin type pattern 210 may include the same material as the first fin type pattern 110, or may include different materials from the first fin type pattern 110.

The first outer conductive pattern 230, the second outer conductive pattern 240 and the third outer conductive pattern 250 may be sequentially formed on the substrate 100. The first outer conductive pattern 230, the second outer conductive pattern 240 and the third outer conductive pattern 250 may be formed on the pre-metal insulating layer 180. A height from the substrate 100 to the upper surface of the gate electrode 120 is smaller than a height from the substrate 100 to the first outer conductive pattern 230. The first outer conductive pattern 230 may be disposed above the upper surface of the gate electrode 120.

The second outer conductive pattern 240 may be formed on the first outer conductive pattern 230 and may be formed below the third outer conductive pattern 250. The first outer conductive pattern 230, the second outer conductive pattern 240, and the third outer conductive pattern 250 may be formed in the first interlayer insulating film 190.

The outer conductive patterns 230, 240, and 250 included in the first conductive guard structure (GD_ST1) may correspond to the respective wiring layers (M1, M2, and M3) included in the wiring structure 195, respectively.

For example, the first outer conductive pattern 230 may be formed at a first metal level on which the first wiring layer (M1) is formed. The second outer conductive pattern 240 may be formed at a second metal level on which the second wiring layer (M2) is formed. The third outer conductive pattern 250 may be formed at a third metal level on which the third wiring layer (M3) is formed.

The second outer conductive pattern 240 formed at the second metal level may be connected to the first outer conductive pattern 230 formed at the first metal level and the third outer conductive pattern 250 formed at the third metal level. For example, the second outer conductive pattern 240 may be in contact with the first outer conductive pattern 230 and the third outer conductive pattern 250.

The first conductive plugs 220 may be disposed between a pair of the second fin type patterns 210. The first conductive plug 220 may be formed in the pre-metal insulating layer 180. The first conductive plug 220 may be connected to the first outer conductive pattern 230.

Although not shown in the configuration illustrated in FIG. 3, an insulating liner may be further formed between the first conductive plug 220 and the second fin type pattern 210, and between the first conductive plug 220 and the field insulating film 105.

Since the wiring layers (M1, M2, and M3) and the outer conductive patterns 230, 240, and 250 disposed at the same metal level are formed at the same level, the wiring layers (M1, M2, and M3) and the outer conductive patterns 230, 240, and 250 disposed at the same metal level may contain the same material. Here, "the same level" means the level formed by the same manufacturing process.

The first outer conductive pattern 230 may include a first outer plate pattern 231 and a first outer via pattern 232. The first outer conductive pattern 230 may further include a first penetration insulation pattern 225a penetrating the first outer plate pattern 231.

The first outer via pattern 232 may protrude from the lower surface of the first outer plate pattern 231 toward the substrate 100. The first outer via pattern 232 may be connected to the first conductive plug 220.

The second outer conductive pattern 240 may include a second outer plate pattern 241, and a second outer via pattern 242. The second outer conductive pattern 240 may include a second penetration insulation pattern 225b penetrating the second outer plate pattern 241.

The second outer plate pattern 241 is disposed on the first outer plate pattern 231. The second outer plate pattern 241 is spaced apart from the first outer plate pattern 231. The first interlayer insulating film 190 may be interposed between the second outer plate pattern 241 and the first outer plate pattern 231.

The second outer plate pattern 241 may include a first portion 241a and a second portion 241b having different thicknesses from each other. For example, the thickness of the first portion 241a of the second outer plate pattern 241 is smaller than the thickness of the second portion 241b of the second outer plate pattern 241, as shown in FIG. 6.

The second outer via pattern 242 may protrude from the lower surface of the second outer plate pattern 241 toward the substrate 100. The second outer via pattern 242 may connect the first outer plate pattern 231 and the second outer plate pattern 241. For example, the second outer via pattern 242 may be in contact with the first outer plate pattern 231.

The third outer conductive pattern 250 may include a third outer plate pattern 251, and a third outer via pattern 252. The third outer conductive pattern 250 may include a third penetration insulation pattern 225c penetrating the third outer plate pattern 251.

The third outer plate pattern 251 is disposed on the second outer plate pattern 241. The third outer plate pattern 251 is spaced apart from the second outer plate pattern 241. The first interlayer insulating film 190 may be interposed between the third outer plate pattern 251 and the second outer plate pattern 241.

The third outer via pattern 252 may protrude from the lower surface of the third outer plate pattern 251 toward the substrate 100. The third outer via pattern 252 may connect the second outer plate pattern 241 and the third outer plate pattern 251. For example, the third outer via pattern 252 may be in contact with the second outer plate pattern 241.

Although each one of the first outer via pattern 232, the second outer via pattern 242 and the third outer via pattern 252 is illustrated, this is for convenience of explanation, and the inventive concepts are not limited thereto.

Although the first outer via pattern 232, the second outer via pattern 242, and the third outer via pattern 252 are illustrated as being aligned in the thickness direction of the substrate 100, the inventive concepts are not limited thereto.

In FIGS. 3 and 6, the thickness of the first outer plate pattern 231, the thickness of the first portion 241a of the second outer plate pattern 241, and the thickness of the third outer plate pattern 251 are illustrated to be the same, but the present inventive concepts are not limited thereto.

In some example embodiments, the first through third penetration insulation patterns 225a, 225b, and 225c may be omitted.

As shown in FIG. 4, the first outer conductive pattern 230 may include a first portion 230a and a second portion 230b having different thicknesses from each other. For example, the thickness (d21) of the first portion 230a of the first outer conductive pattern 230 is smaller than the thickness (d22) of the second portion 230b of the first outer conductive pattern 230.

The first portion 230a of the first outer conductive pattern 230 may be a part of the first outer plate pattern 231. The second portion 230b of the first outer conductive pattern 230 may include the first outer via pattern 232, and a part of the first outer plate pattern 231 connected to the first outer via pattern 232.

In other words, the first outer plate pattern 231 may include a part of the second portion 230b of the first outer conductive pattern 230, and the first portion 230a of the first outer conductive pattern 230. The first outer via pattern 232 may be a part of the second portion 230b of the first outer conductive pattern 230.

The second portion 230b of the first outer conductive pattern 230 may be connected to the first conductive plug 220.

Since the explanation of the third outer conductive pattern 250 may be similar to the explanation of the first portion 230a of the first outer conductive pattern 230 and the second portion 230b of the first outer conductive pattern 230, explanation of the third outer conductive pattern 250 will be omitted.

As shown in FIG. 5, the second outer conductive pattern 240 may include a first portion 240a, a second portion 240b, and a third portion 240c having different thicknesses. The thickness (d12) of the second portion 240b of the second outer conductive pattern 240 is greater than the thickness (d11) of the first portion 240a of the second outer conductive pattern 240, and is smaller than the thickness (d13) of the third portion 240c of the second outer conductive pattern 240.

The second outer plate pattern 241 includes a part of the third portion 240c of the second outer conductive pattern 240, a first portion 240a of the second outer conductive pattern 240, and a second portion 240b of the second outer conductive pattern 240. The second outer via pattern 242 may be a part of the third portion 240c of the second outer conductive pattern 240.

A part of the first interlayer insulating film 190 is interposed between the first portion 240a of the second outer conductive pattern 240 and the first outer conductive pattern 230, and between the second portion 240b of the second outer conductive pattern 240 and the first outer conductive pattern 230.

The third portion 240c of the second outer conductive pattern 240 may be connected to the first outer conductive pattern 230. For example, the third portion 240c of the second outer conductive pattern 240 may be in contact with the first outer conductive pattern 230.

The first portion 240a of the second outer conductive pattern 240 may be disposed between the second portion 240b of the second outer conductive pattern 240 and the third portion 240c of the second outer conductive pattern 240.

FIG. 3 illustrates a configuration in which the second outer conductive pattern 240 includes three portions having different thicknesses, but the inventive concepts are not limited thereto. The first outer conductive pattern 230 and/or the third outer conductive pattern 250 rather than the second outer conductive pattern 240 may include three portions having different thicknesses.

In addition to the fact that the second outer conductive pattern 240 includes three portions having different thicknesses, either one of the first outer conductive pattern 230 and the third outer conductive pattern 250 may have three (or more) portions with different thicknesses.

Figure 7:
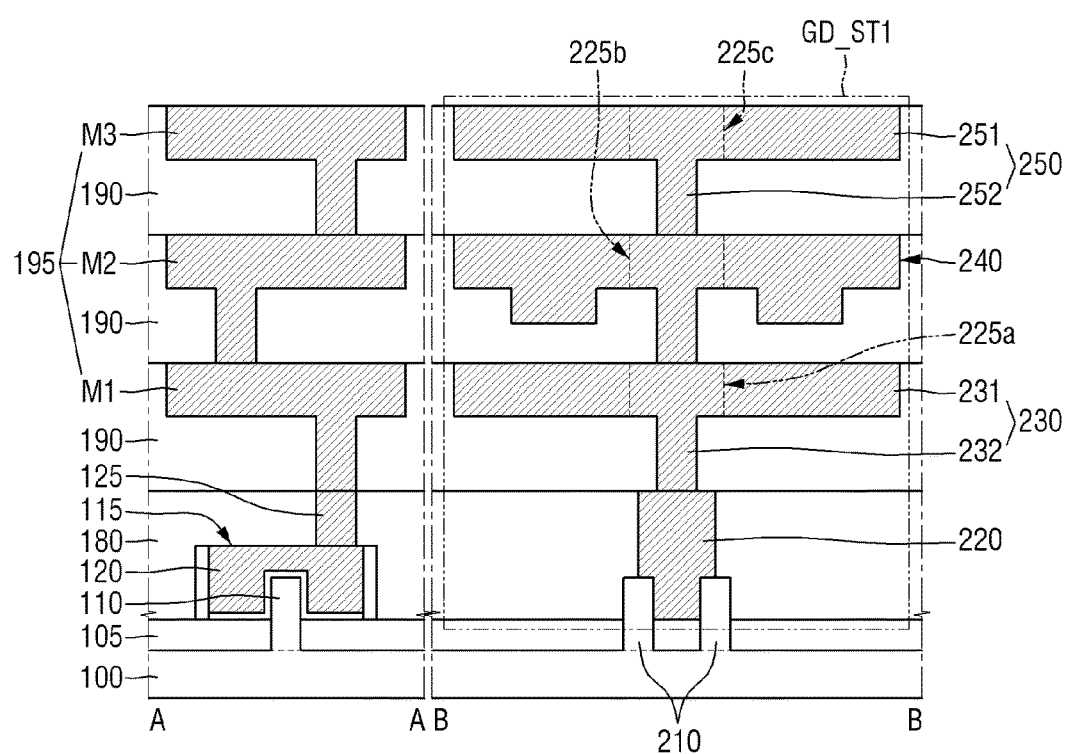
FIG. 7 is a diagram for explaining a semiconductor device according to some example embodiments of the present inventive concepts.
Figure 8A:
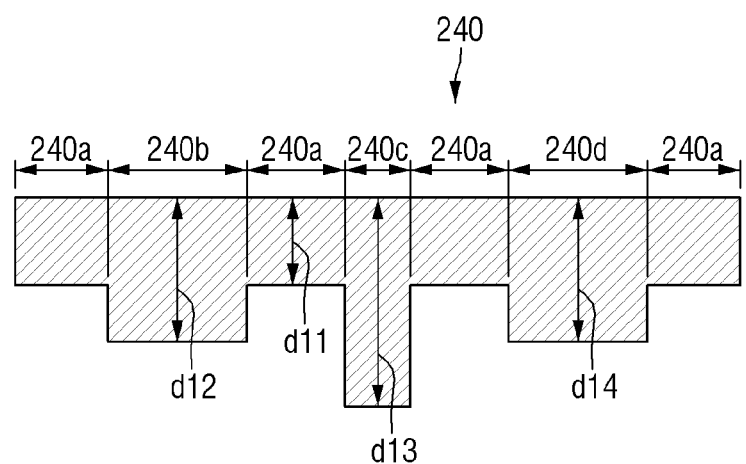
FIG. 8a and FIG. 8b are diagrams for explaining the second outer conductive pattern of FIG. 2.
Figure 8B:
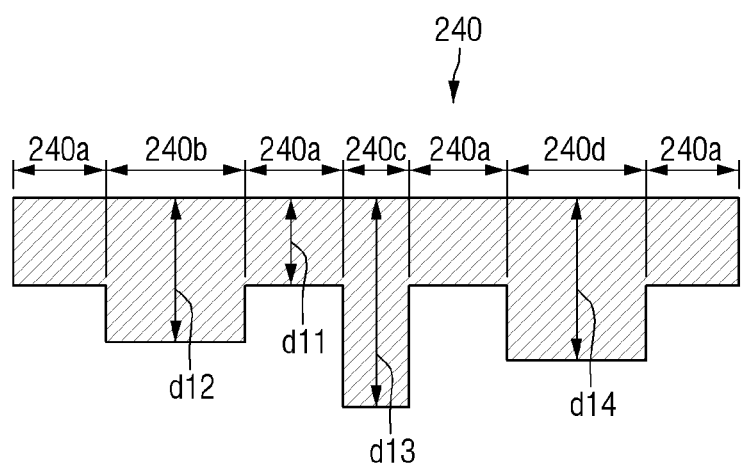

FIG. 7 is a diagram for explaining the semiconductor device according to some example embodiments of the present inventive concepts. FIGS. 8a and 8b are diagrams for explaining the second outer conductive pattern 240 of FIG. 7. For the sake of convenience of explanation, differences from those described with reference to FIGS. 1 to 6 will be described in more detail.

Referring to FIGS. 7 to 8a, in the semiconductor device according to some example embodiments of the present inventive concepts, the second outer conductive pattern 240 may further include a fourth portion 240d having different thickness from the first portion 240a of the second outer conductive pattern 240 and the third portion 240c of the second outer conductive pattern 240.

The thickness (d14) of the fourth portion 240d of the second outer conductive pattern 240 is greater than the thickness (d11) of the first portion 240a of the second outer conductive pattern 240, and is smaller than the thickness (d13) of the third portion 240c of the second outer conductive pattern 240.

The second outer plate pattern 241 includes a part of the third portion 240c of the second outer conductive pattern 240, the first portion 240a of the second outer conductive pattern 240, the second portion 240b of the second outer conductive pattern 240, and the fourth portion 240d of the second outer conductive pattern 240. A part of the first interlayer insulating film 190 is interposed between the fourth portion 240d of the second outer conductive pattern 240 and the first outer conductive pattern 230.

The first portion 240a of the second outer conductive pattern 240 may be disposed between the fourth portion 240d of the second outer conductive pattern 240 and the third portion 240c of the second outer conductive pattern 240.

FIG. 7 illustrates a configuration in which the third portion 240c of the second outer conductive pattern 240 is disposed between the second portion 240b of the second outer conductive pattern 240 and the fourth portion 240d of the second outer conductive pattern 240, but the inventive concepts are not limited thereto. The second portion 240b of the second outer conductive pattern 240 and the fourth portion 240d of the second outer conductive pattern 240 may be disposed on one side of the third portion 240c of the second outer conductive pattern 240.

The thickness (d12) of the second portion 240b of the second outer conductive pattern 240 may be substantially the same as the thickness (d14) of the fourth portion 240d of the second outer conductive pattern 240. Here, "the same thickness" means not only the case where the thicknesses are completely the same at the two positions to be compared but also a fine difference in the thickness which may occur due to the process and procedure margin and the like.

In FIG. 8b, the thickness (d12) of the second portion 240b of the second outer conductive pattern 240 may be different from the thickness (d14) of the fourth portion 240d of the second outer conductive pattern 240.

Unlike the configuration illustrated in FIG. 7, the second outer conductive pattern 240 may include three or more regions having thicknesses different from those of the first portion 240a of the second outer conductive pattern 240 and the third portion 240c of the second outer conductive pattern 240.

Figure 9:
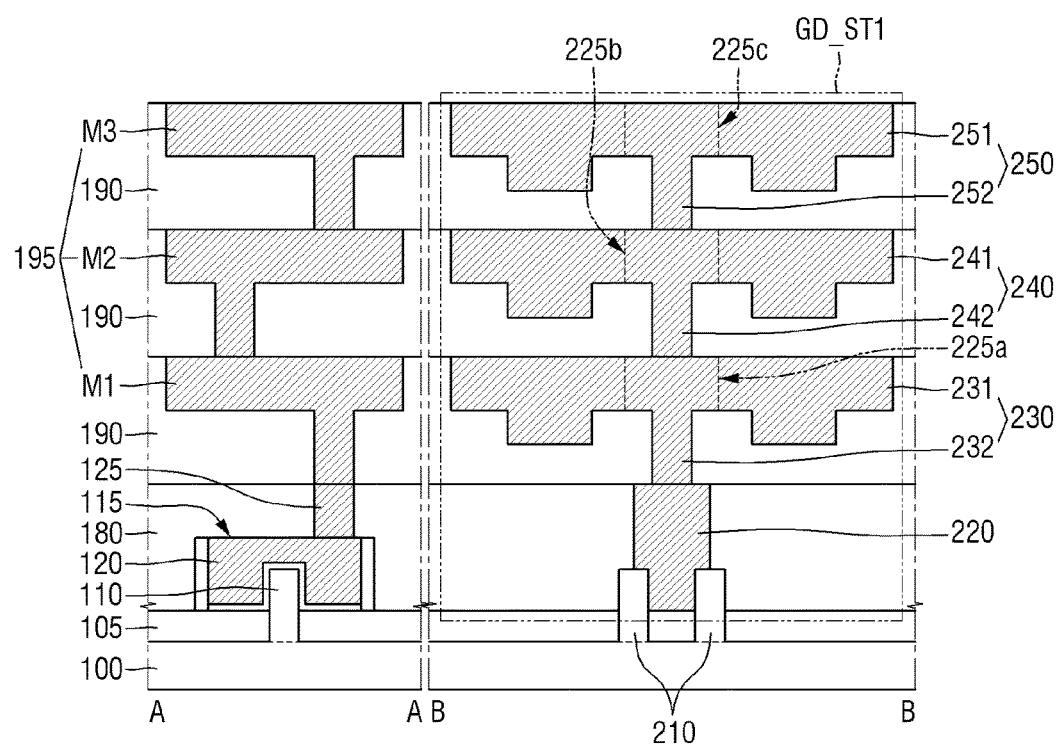
FIG. 9 is a diagram for explaining the semiconductor device according to some example embodiments of the present inventive concepts.
Figure 10:
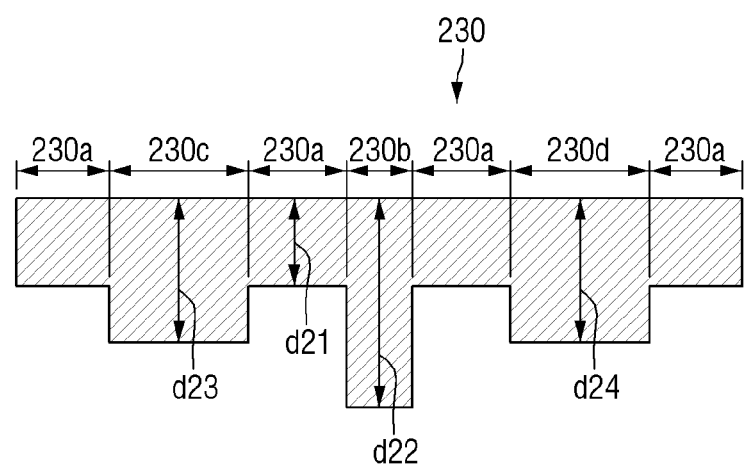
FIGS. 10 and 11 are diagrams for explaining the first outer conductive pattern of FIG. 9.
Figure 11:
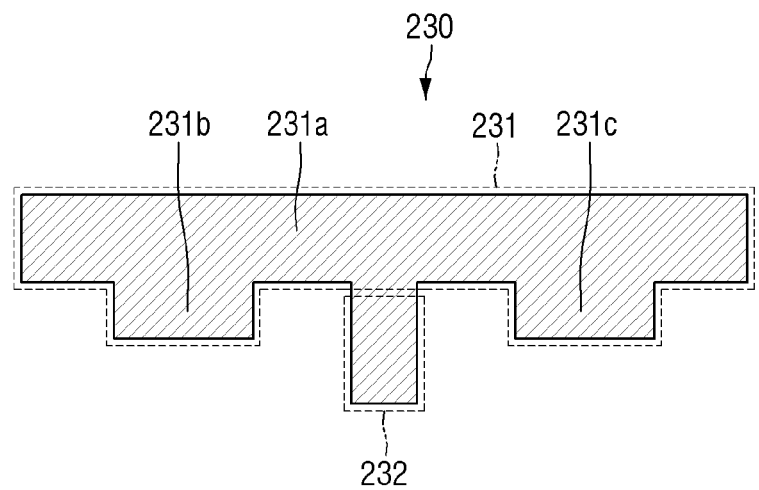

FIG. 9 is a diagram for explaining a semiconductor device according to some example embodiments of the present inventive concepts. FIGS. 10 and 11 are diagrams for explaining the first outer conductive pattern of FIG. 9. For the sake of convenience of explanation, differences from those described with reference to FIGS. 7 to 8b will be described in more detail.

Referring to FIGS. 9 through 11, in the semiconductor device according to some example embodiments of the present inventive concepts, the first outer conductive pattern 230 may further include a third portion 230c and a fourth portion 230d having thicknesses different from those of the first portion 230a of the first outer conductive pattern 230 and the second portion 230b of the first outer conductive pattern 230.

The thickness (d23) of the third portion 230c of the first outer conductive pattern 230 and the thickness (d24) of the fourth portion 230d of the first outer conductive pattern 230 are greater than the thickness (d21) of the first portion 230a of the first outer conductive pattern 230 and smaller than the thickness (d22) of the second portion 230b of the first outer conductive pattern 230, respectively.

The first portion 230a of the first outer conductive pattern 230 may be disposed between the second portion 230b of the first outer conductive pattern 230 and the third portion 230c of the first outer conductive pattern 230. The first portion 230a of the first outer conductive pattern 230 may be disposed between the second portion 230b of the first outer conductive pattern 230 and the fourth portion 230d of the first outer conductive pattern 230.

In FIGS. 9 and 10, the second portion 230b of the first outer conductive pattern 230 is illustrated as being disposed between the third portion 230c of the first outer conductive pattern 230 and the fourth portion 230d of the first outer conductive pattern 230, but the present inventive concepts are not limited thereto. The third portion 230c of the first outer conductive pattern 230 and the fourth portion 230d of the first outer conductive pattern 230 may be disposed on one side of the second portion 230b of the first outer conductive pattern 230.

The first outer plate pattern 231 may include a first portion 231a, a second portion 231b, and a third portion 231c having different thicknesses from one another. For example, the thickness of the first portion 231a of the first outer plate pattern 231 is smaller than the thickness of the second portion 231b of the first outer plate pattern 231 and the thickness of the third portion 231c of the first outer plate pattern 231.

The first outer plate pattern 231 includes a part of the second portion 230b of the first outer conductive pattern 230, the first portion 230a of the first outer conductive pattern 230, the third portion 230c of the first outer conductive pattern 230, and the fourth portion 230d of the first outer conductive pattern 230. The first outer via pattern 232 may be a part of the second portion 230b of the first outer conductive pattern 230.

Since the explanation of the third outer conductive pattern 250 may be similar to the explanation of the first outer conductive pattern 230 described with reference to FIGS. 10 and 11, the explanation of the third outer conductive pattern 250 will not be provided.

Figure 12:
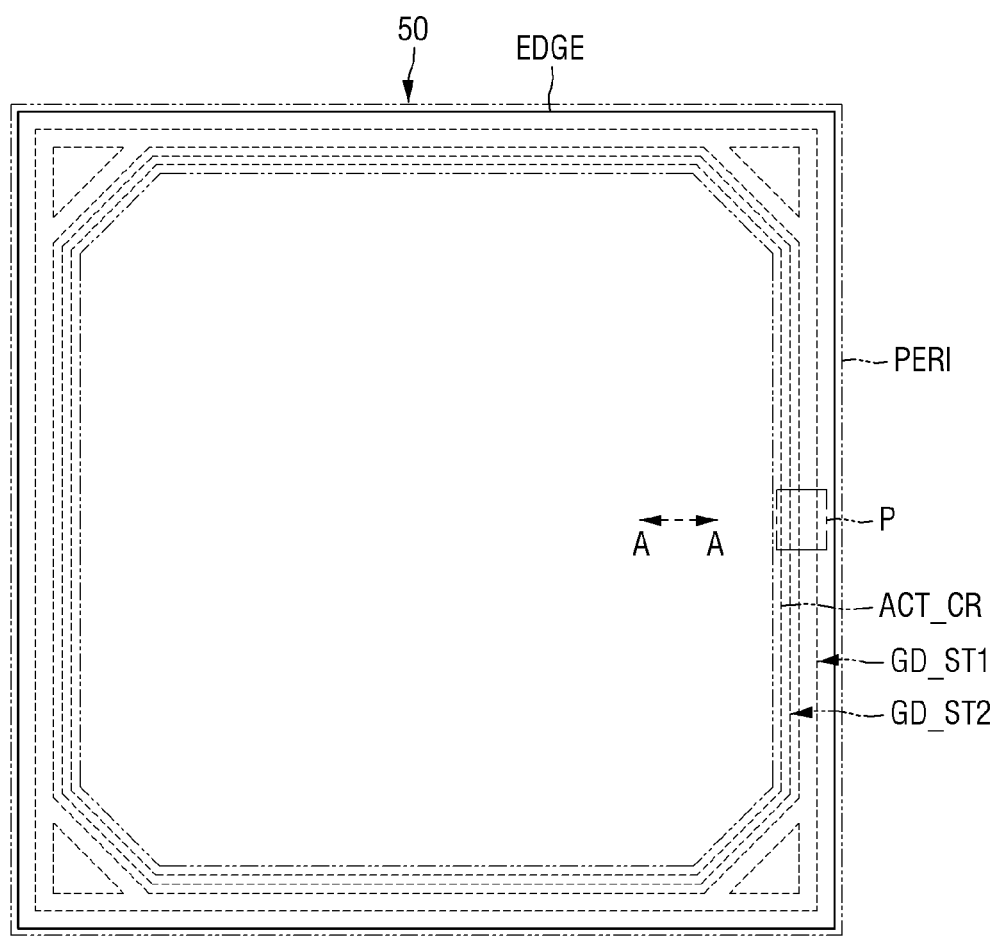
FIG. 12 is a plan view for explaining the semiconductor device according to some example embodiments of the present inventive concepts.
Figure 13:
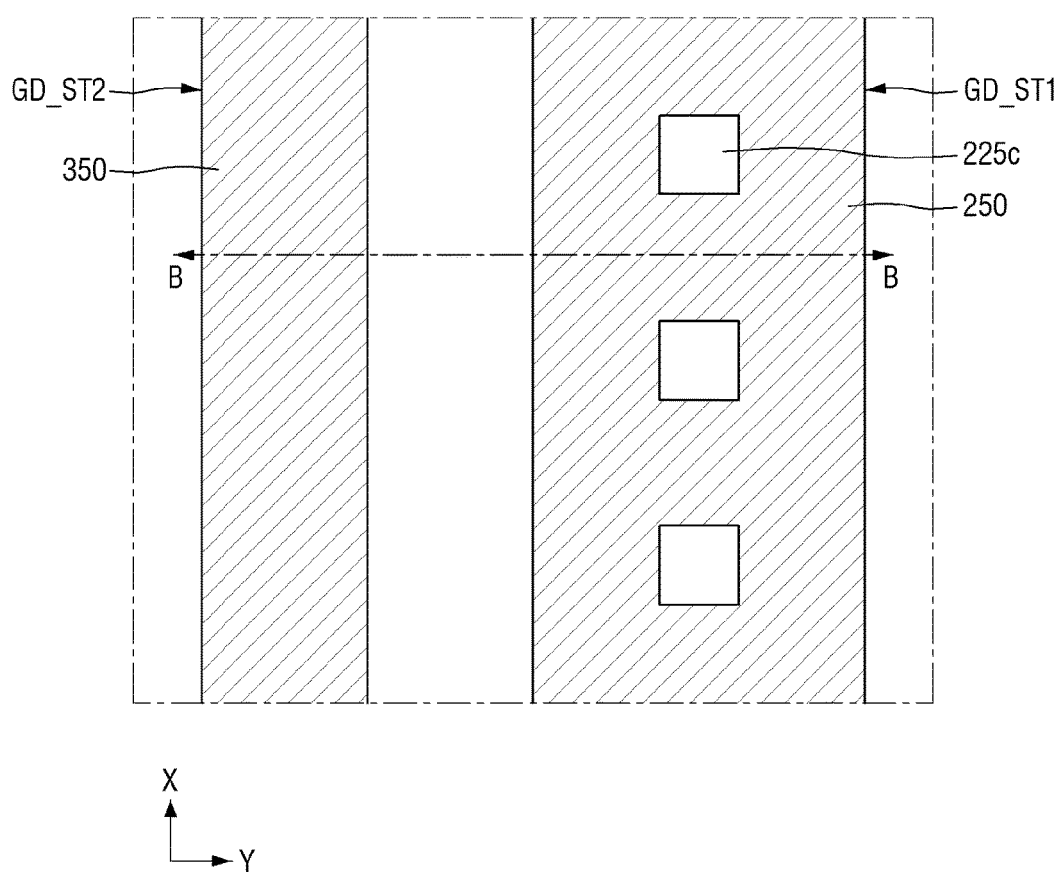
FIG. 13 is an enlarged view of a region P of FIG. 12.
Figure 14:
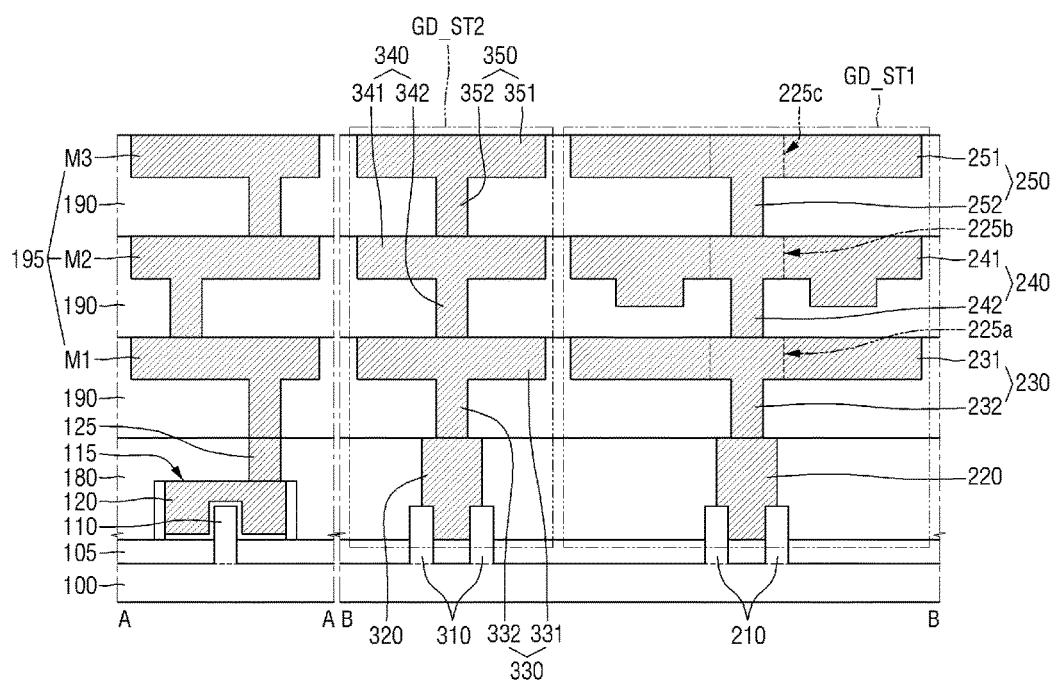
FIG. 14 is a cross-sectional view taken along the line A-A of FIG. 12 and the line B-B of FIG. 13.
Figure 15:
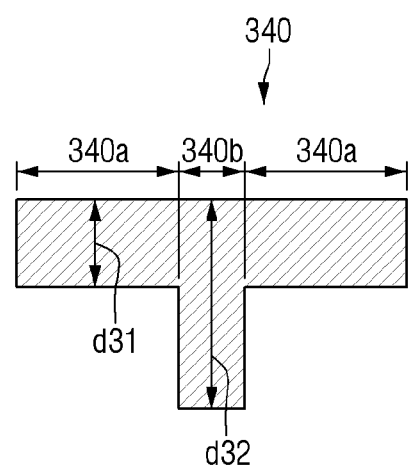
FIG. 15 is a diagram for explaining the second inner conductive pattern of FIG. 14.

FIG. 12 is a plan view for explaining the semiconductor device according to some example embodiments of the present inventive concepts. FIG. 13 is an enlarged view of a region P of FIG. 12. FIG. 14 is a cross-sectional view taken along line A-A of FIG. 12 and line B-B of FIG. 13. FIG. 15 is a diagram for explaining the second inner conductive pattern of FIG. 14. For convenience of explanation, differences from those described with reference to FIGS. 1, 2, 4, and 7 to 8b will be described in more detail.

For reference, FIGS. 13 and 14 illustrate the configuration in which the first interlayer insulating film does not cover the uppermost wiring layer, the upper surface of the outer conductive pattern, and the upper surface of the inner conductive pattern.

Referring to FIGS. 12 to 14, the semiconductor device 50 according to some example embodiments of the present inventive concepts may further include a second conductive guard structure (GD_ST2) formed in the boundary region (PERI).

The second conductive guard structure (GD_ST2) may be formed along the boundary region (PERI). In order to protect the internal circuit formed in the active circuit region (ACT_CR), the second conductive guard structure (GD_ST2) may be disposed to surround the active circuit region (ACT_CR).

The second conductive guard structure (GD_ST2) may be disposed to be closer to the active circuit region (ACT_CR) than the first conductive guard structure (GD_ST1).

For example, the first conductive guard structure (GD_ST1) may include a crack stop structure which surrounds an internal circuit formed in the active circuit region (ACT_CR). The second conductive guard structure (GD_ST2) may include a moisture oxidation barrier structure which surrounds the internal circuit formed in the active circuit region (ACT_CR). However, alternatively, the first conductive guard structure (GD_ST1) may include a moisture oxidation barrier structure, and the second conductive guard structure (GD_ST2) may include a crack stop structure.

In FIG. 12, the second conductive guard structure (GD_ST2) is illustrated to have a polygonal ring shape with chamfered corners, but the present inventive concepts are not limited thereto.

The second conductive guard structure (GD_ST2) may be formed on the substrate 100 of the boundary region (PERI). The second conductive guard structure (GD_ST2) may include a pair of third fin type patterns 310, a first inner conductive pattern 330, a second inner conductive pattern 340, and/or a third inner conductive pattern 350.

The third fin type pattern 310 may be disposed on the substrate 100 of the boundary region (PERI). Although the third fin type pattern 310 is illustrated to extend in the first direction (X), it is for convenience of explanation, and the inventive concepts are not limited thereto.

The field insulating film 105 may cover a part of the sidewalls of the third fin type pattern 310. The third fin type pattern 310 may protrude upward from the upper surface of the field insulating film 105. The third fin type pattern 310 may include the same material as the first fin type pattern 110 and/or the second fin type pattern 210, or may include different materials from each other.

The first inner conductive pattern 330, the second inner conductive pattern 340, and the third inner conductive pattern 350 may be sequentially formed on the substrate 100. The first inner conductive pattern 330, the second inner conductive pattern 340, and the third inner conductive pattern 350 may be formed on the pre-metal insulating layer 180. The height from the substrate 100 to the upper surface of the gate electrode 120 is smaller than the height from the substrate 100 to the first inner conductive pattern 330. The first inner conductive pattern 330 may be disposed above the upper surface of the gate electrode 120.

The second inner conductive pattern 340 may be formed over the first inner conductive pattern 330 and may be formed below the third inner conductive pattern 350. The first inner conductive pattern 330, the second inner conductive pattern 340, and the third inner conductive pattern 350 may be formed in the first interlayer insulating film 190.

Each of the inner conductive patterns 330, 340, and 350 included in the second conductive guard structure (GD_ST2) may correspond to each of the wiring layers (M1, M2, and M3) included in the wiring structure 195 and each of the outer conductive patterns 230, 240, and 250 included in the first conductive guard structure (GD_ST1).

The first inner conductive pattern 330 may be formed at a first metal level on which the first wiring layer (M1) and the first outer conductive pattern 230 are formed. The second inner conductive pattern 340 may be formed at a second metal level on which the second wiring layer (M2) and the second outer conductive pattern 240 are formed. The third inner conductive pattern 350 may be formed at a third metal level on which the third wiring layer (M3) and the third outer conductive pattern 250 are formed.

The second inner conductive pattern 340 formed at the second metal level may be connected to the first inner conductive pattern 330 formed at the first metal level and the third inner conductive pattern 350 formed at the third metal level. For example, the second inner conductive pattern 340 may be in contact with the first inner conductive pattern 330 and the third inner conductive pattern 350.

The first inner conductive pattern 330 is spaced apart from the first outer conductive pattern 230, and a part of the first interlayer insulating film 190 is interposed between the first inner conductive pattern 330 and the first outer conductive pattern 230. The second inner conductive pattern 340 is spaced apart from the second outer conductive pattern 240. The third inner conductive pattern 350 is spaced apart from the third outer conductive pattern 250.

The second conductive plug 320 may be disposed between a pair of third fin type patterns 310. The second conductive plug 320 may be formed in the pre-metal insulating layer 180. The second conductive plug 320 may be connected to the first inner conductive pattern 330.

Although not shown in the configuration illustrated in FIG. 14, an insulating liner may be further formed between the second conductive plug 320 and the third fin type pattern 310, and between the second conductive plug 320 and the field insulating film 105.

Since the wiring layers (M1, M2, and M3) and the inner conductive patterns 330, 340, and 350, which are disposed at the same metal, are formed at the same level, the wiring layers (M1, M2, and M3) and the inner conductive patterns 330, 340, and 350 may include the same material.

The first inner conductive pattern 330 may include a first inner plate pattern 331, and a first inner via pattern 332. The first inner via pattern 332 may protrude from the lower surface of the first inner plate pattern 331 toward the substrate 100. The first inner via pattern 332 may be connected to the second conductive plug 320.

The second inner conductive pattern 340 may include a second inner plate pattern 341 and a second inner via pattern 342. The second inner plate pattern 341 is disposed on the first inner plate pattern 331. The second inner plate pattern 341 is spaced apart from the first inner plate pattern 331. The first interlayer insulating film 190 may be interposed between the second inner plate pattern 341 and the first inner plate pattern 331.

The second inner via pattern 342 may protrude from the lower surface of the second inner plate pattern 341 toward the substrate 100. The second inner via pattern 342 may connect the first inner plate pattern 331 and the second inner plate pattern 341. For example, the second inner via pattern 342 may be in contact with the first inner plate pattern 331.

The third inner conductive pattern 350 may include a third inner plate pattern 351 and a third inner via pattern 352. The third inner plate pattern 351 is disposed on the second inner plate pattern 341. The third inner plate pattern 351 is spaced apart from the second inner plate pattern 341. The first interlayer insulating film 190 may be interposed between the third inner plate pattern 351 and the second inner plate pattern 341.

The third inner via pattern 352 may protrude from the lower surface of the third inner plate pattern 351 toward the substrate 100. The third inner via pattern 352 may connect the second inner plate pattern 341 and the third inner plate pattern 351. For example, the third inner via pattern 352 may be in contact with the second inner plate pattern 341.

Although each one of the first inner via pattern 332, the second inner via pattern 342, and the third inner via pattern 352 is illustrated, this is only for convenience of explanation, and the inventive concepts are not limited thereto.

Although the first inner via pattern 332, the second inner via pattern 342, and the third inner via pattern 352 are illustrated as being aligned the thickness direction of the substrate 100, the inventive concepts are not limited thereto.

The second inner conductive pattern 340 may include a first portion 340a and a second portion 340b having different thicknesses. For example, the thickness (d31) of the first portion 340a of the second inner conductive pattern 340 is smaller than the thickness (d32) of the second portion 340b of the second inner conductive pattern 340.

The second inner plate pattern 341 may include a part of the second portion 340b of the second inner conductive pattern 340, and a first portion 340a of the second inner conductive pattern 340. The second inner via pattern 342 may be a part of the second portion 340b of the second inner conductive pattern 340.

The second portion 340b of the second inner conductive pattern 340 may be connected to the first inner conductive pattern 330. For example, the second portion 340b of the second inner conductive pattern 340 may be in contact with the first inner conductive pattern 330.

In addition, the description of the first inner conductive pattern 330 and the third inner conductive pattern 350 may be similar to the description of the first portion 340a of the second inner conductive pattern 340 and the second portion 340b of the second inner conductive pattern 340, the description of the first inner conductive pattern 330 and the third inner conductive pattern 350 will be omitted.

In the semiconductor device according to some example embodiments of the present inventive concepts, the thickness (d31) of the first portion 340a of the second inner conductive pattern 340 may be substantially the same as the thickness (d11 of FIG. 8a) of the first portion 240a of the second outer conductive pattern 240.

Also, the thickness of the first inner plate pattern 331 may be substantially the same as the thickness of the first outer plate pattern 231, and the thickness of the third inner plate pattern 351 may be substantially the same as the thickness of the third outer plate pattern 251.

Figure 16:
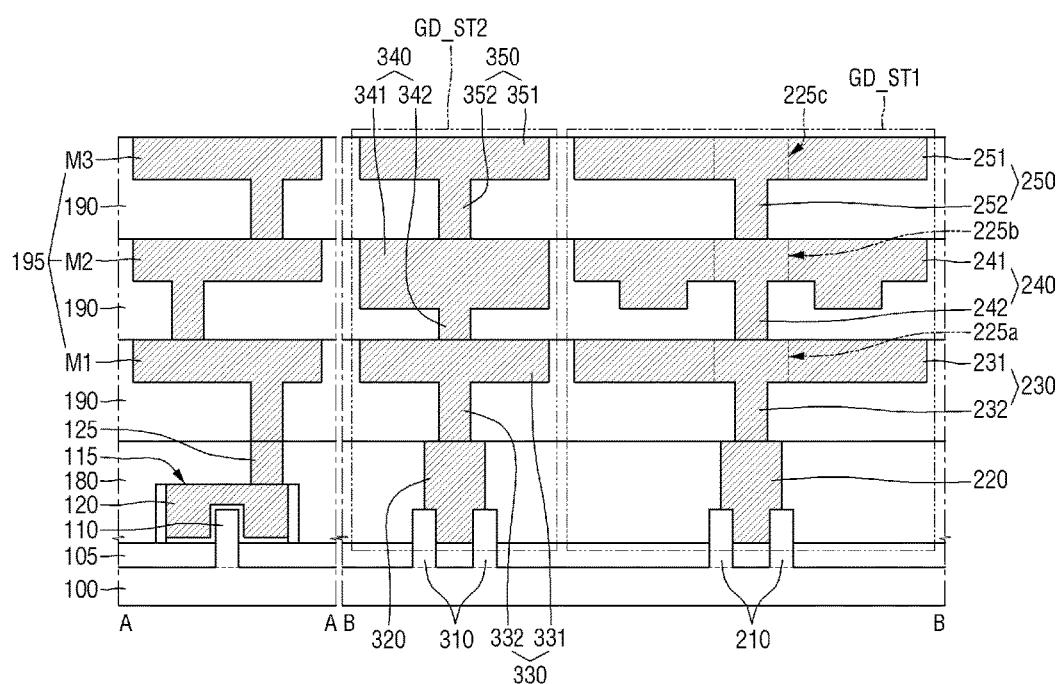
FIG. 16 is a diagram for explaining the semiconductor device according to some example embodiments of the present inventive concepts.

FIG. 16 is a diagram for explaining the semiconductor device according to some example embodiments of the present inventive concepts. For the sake of convenience of explanation, differences from those described with reference to FIGS. 12 to 15 will be described in more detail.

Referring to FIGS. 15 and 16, in the semiconductor device according to some example embodiments of the present inventive concepts, the thickness (d31) of the first portion 340a of the second inner conductive pattern 340 may be substantially the same as the thickness (d31) of the thick portion of the second outer plate pattern 241.

For example, the thickness (d31) of the first portion 340a of the second inner conductive pattern 340 may be substantially the same as the thickness (d12 of FIG. 8a) of the second outer conductive pattern 240 or the thickness (d14 of FIG. 8a) of the second outer conductive pattern 240.

Figure 17:
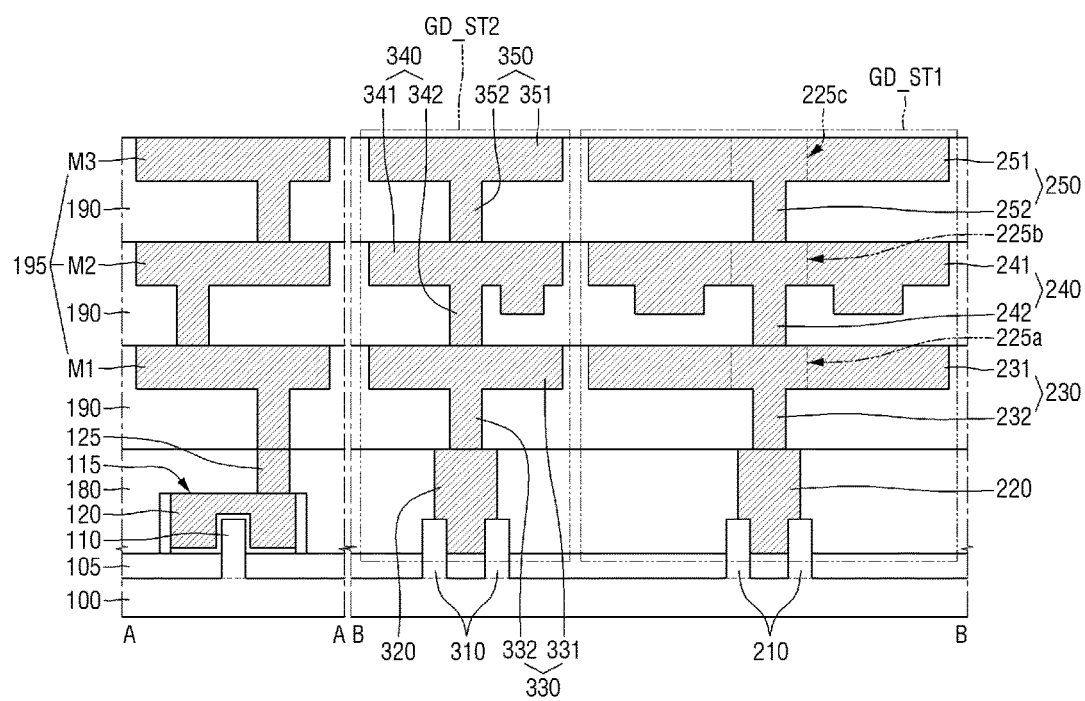
FIG. 17 is a diagram for explaining the semiconductor device according to some example embodiments of the present inventive concepts.
Figure 18:
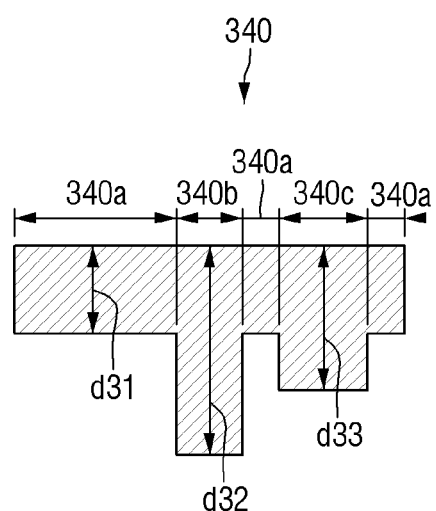
FIG. 18 is a diagram for explaining the second inner conductive pattern of FIG. 17.

FIG. 17 is a diagram for explaining the semiconductor device according to some example embodiments of the present inventive concepts. FIG. 18 is a diagram for explaining the second inner conductive pattern 340 of FIG. 17. For the sake of convenience of explanation, differences from those described with reference to FIGS. 12 to 15 will be mainly described.

Referring to FIGS. 17 and 18, in the semiconductor device according to some example embodiments of the present inventive concepts, the second inner conductive pattern 340 may further include a third portion 340c having different thickness from the first portion 340a of the second inner conductive pattern and the second portion 340b of the second inner conductive pattern 340.

The thickness (d33) of the third portion 340c of the second inner conductive pattern 340 is greater than the thickness (d31) of the first portion 340a of the second inner conductive pattern 340, and is smaller than the thickness (d32) of the second portion 340b portion 340b of the second inner conductive pattern 340.

For example, the thickness (d33) of the third portion 340c of the second inner conductive pattern 340 may be substantially the same as the thickness (d12 of FIG. 8a) of the second portion of the second outer conductive pattern 240 or the thickness (d14 of FIG. 8a) of the fourth portion of the second outer conductive pattern 240. The thickness (d31) of the first portion 340a of the second inner conductive pattern 340 may be substantially the same as the thickness (d31) of the first portion 340a of the second inner conductive pattern 340.

The first portion 340a of the second inner conductive pattern 340 may be disposed between the second portion 340b of the second inner conductive pattern 340 and the third portion 340c of the second inner conductive pattern 340.

The second inner plate pattern 341 may include a part of the second portion 340b of the second inner conductive pattern, the first portion 340a of the second inner conductive pattern, and the third portion 340c of the second inner conductive pattern. Since the second inner plate pattern 341 includes the first portion 340a of the second inner conductive pattern and the third portion 340c of the second inner conductive pattern having the different thicknesses, the second inner plate pattern 341 may include a portion having the first thickness (d31) and a portion having the second thickness (d33).

Figure 19:
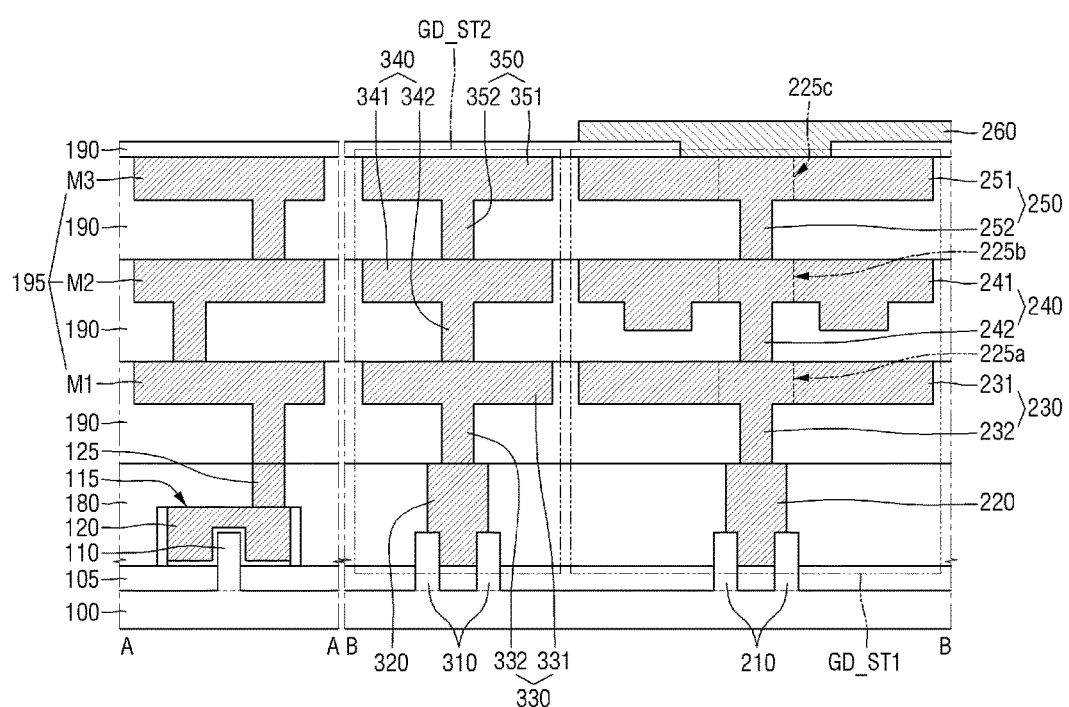
FIG. 19 is a diagram for explaining the semiconductor device according to some example embodiments of the present inventive concepts.

FIG. 19 is a diagram for explaining the semiconductor device according to some example embodiments of the present inventive concepts. For the sake of convenience of explanation, differences from those described with reference to FIGS. 12 to 15 will be described in more detail.

Referring to FIG. 19, the semiconductor device according to some example embodiments of the present inventive concepts may further include a pad conductive structure 260 on the substrate 100 of the boundary region (PERI).

The pad conductive structure 260 may be disposed on the first conductive guard structure (GD_ST1). The pad conductive structure 260 may be connected to the first conductive guard structure (GD_ST1). The pad conductive structure 260 may be connected to the third outer conductive pattern 250.

The pad conductive structure 260 may include the same material as the third outer conductive pattern 250, or may include the material different from the third outer conductive pattern 250.

Figure 20:
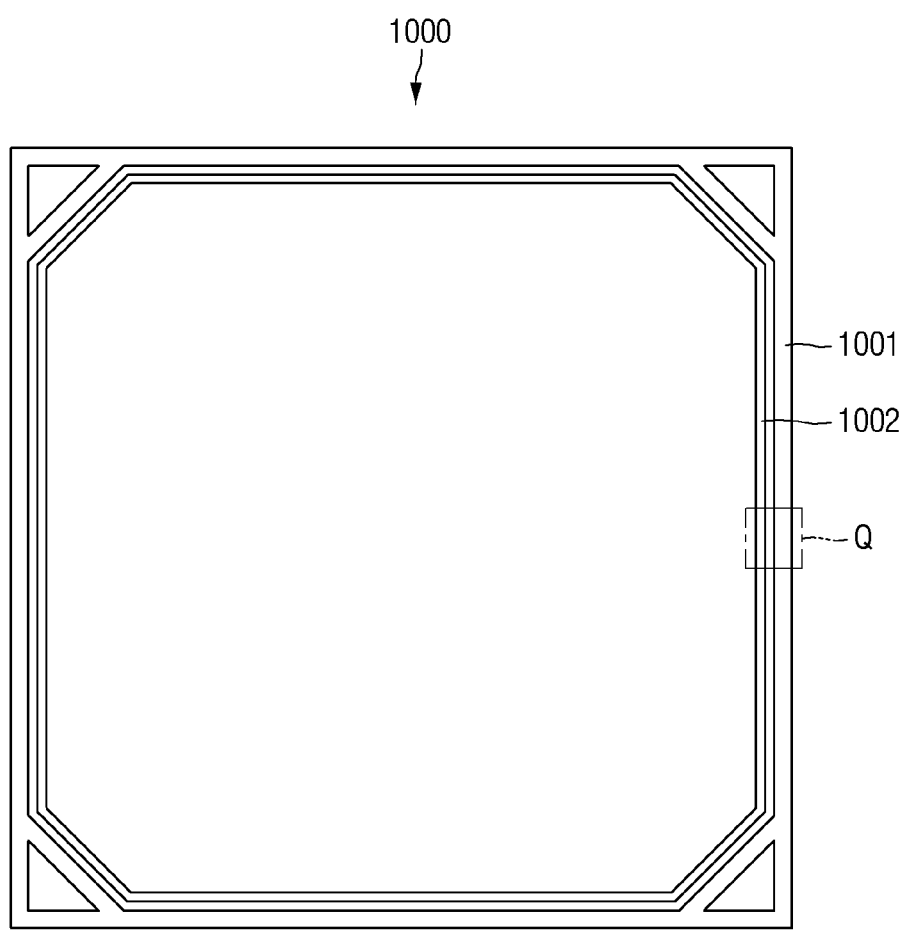
FIG. 20 is a layout design of a guard structure used for manufacturing the semiconductor device according to some example embodiments of the present inventive concepts.
Figure 21:
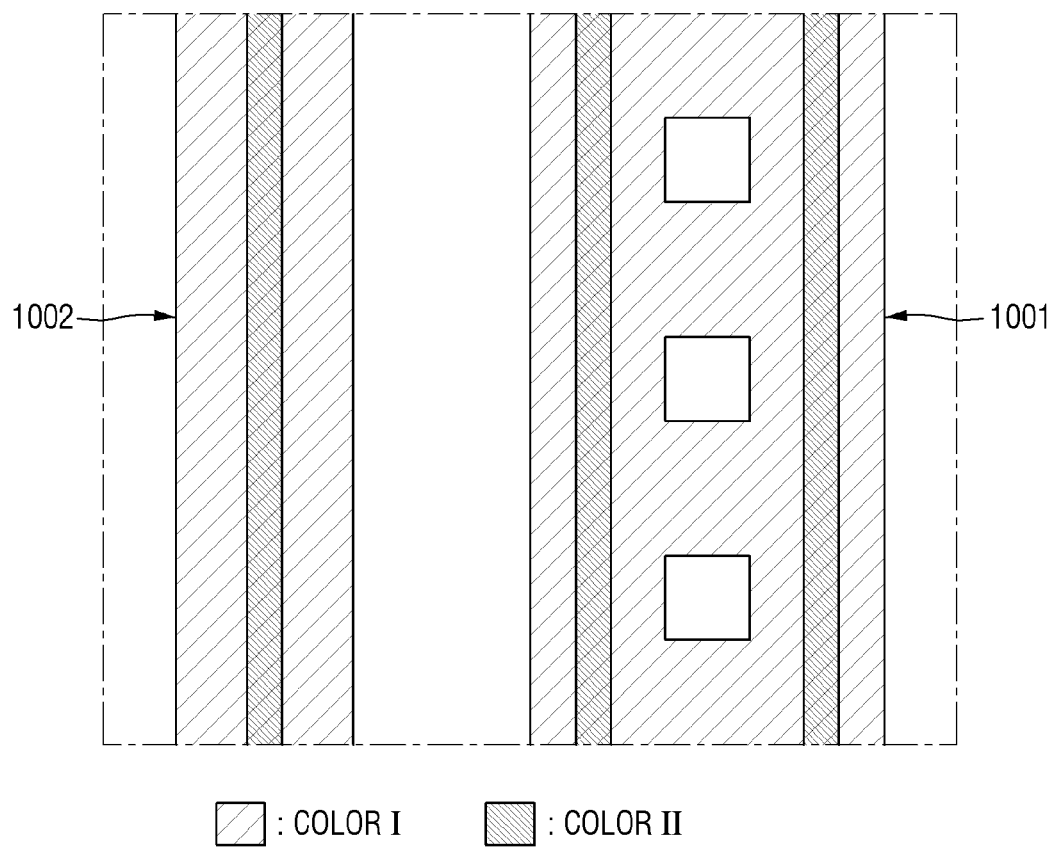
FIG. 21 is a layout diagram for explaining a layout design method for the semiconductor device according to some example embodiments of the present inventive concepts.

FIG. 20 is a layout design of a guard structure used for manufacturing the semiconductor device according to some example embodiments of the present inventive concepts. FIG. 21 is a layout diagram for explaining a layout design method for the semiconductor device according to some example embodiments of the present inventive concepts.

For reference, FIG. 20 is a diagram illustrating only the guard structure portion of the layout design of the semiconductor device. FIG. 21 is a diagram for explaining the layout design method by enlarging a part Q of FIG. 20 in the layout design of the guard structure.

Referring to FIG. 20, the guard structure 1000 may include a first guard structure pattern 1001 and a second guard structure pattern 1002.

The first guard structure pattern 1001 may have a shape in which a polygonal ring with chamfered corners is combined with a square ring. The second guard structure pattern 1002 may be located inside the first guard structure pattern 1001 and may have a polygonal ring shape with chamfered corners.

Referring to FIG. 21, the first guard structure pattern 1001 is generated, using the first color pattern (COLOR I) and the second color pattern (COLOR II). The second guard structure pattern 1002 is generated, using the first color pattern (COLOR I) and the second color pattern (COLOR II).

For example, the layout design of the first guard structure pattern 1001 and the second guard structure pattern 1002 may be generated, using the first color pattern (COLOR I).

Further, the layout design of a part of the first guard structure pattern 1001 and/or a part of the second guard structure pattern 1002 may be generated, using the second color pattern (COLOR II).

In the first guard structure pattern 1001 and the second guard structure pattern 1002 in which the layout design is generated using the second color pattern (COLOR II), the layout design may generated in duplicate by the first color pattern (COLOR I) and the second color pattern (COLOR II).

A first photomask corresponding to the first color pattern (COLOR I) may be manufactured, and a second photomask corresponding to the second color pattern (COLOR II) may be manufactured. A photo process for forming the first conductive guard structure (GD_ST1 of FIG. 12) and the second conductive guard structure (GD_ST2 of FIG. 12) may be performed, using the first photomask and the second photomask.

With the higher integration of the semiconductor devices, the line width of the wiring included in the semiconductor device has been further miniaturized. Layout design using a plurality of color patterns may be used to form the wiring with finer line widths. That is, multi-patterning processes using a plurality of color patterns may be utilized.

In the semiconductor devices using the miniaturized line widths, imbalances of color patterns in the layout design may be sensitive to the photo processes and the like performed, using the layout design. That is, the imbalance of the color pattern in the layout design may degrade the reliability of the semiconductor device.

However, the imbalance of the color pattern can be improved, by generating a layout design for a layout having one closed structure (for example, a guard structure pattern), using a plurality of color patterns.

FIGS. 22 to 30 are intermediate stage diagrams for explaining a method for manufacturing the semiconductor device according to some example embodiments of the present inventive concepts.

The method for manufacturing the semiconductor device described below may relate to a method for forming a conductive wiring, using a plurality of photomasks. The plurality of photomasks may utilize a layout design which utilizes a plurality of color patterns described with reference to FIGS. 20 and 21.

However, the method for manufacturing the semiconductor device to be described below may be used for forming a moisture oxidation barrier structure and/or a crack stop structure formed in the boundary region of the semiconductor chip, and the method for manufacturing the semiconductor device may be used for forming a wiring structure (195 of FIG. 3) formed in the active circuit region (ACT_CR of FIG. 1).

Figure 22:
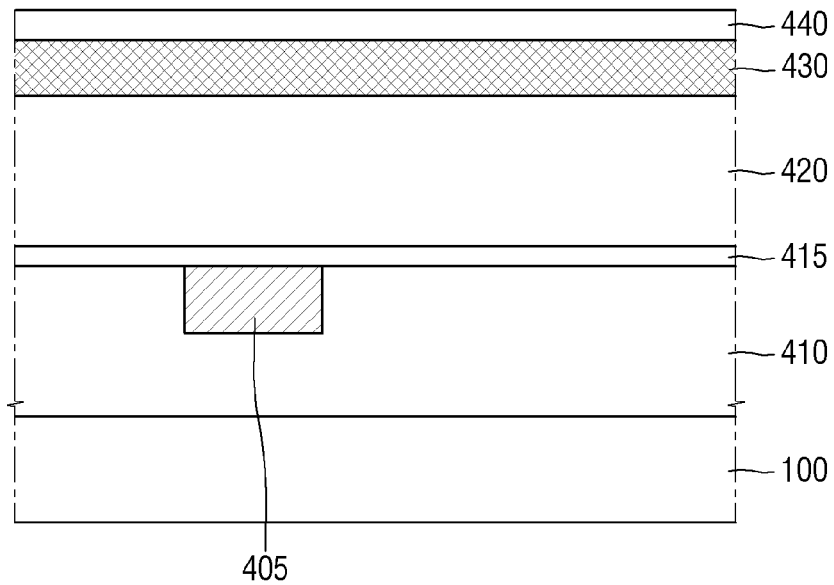
FIGS. 22 through 30 are intermediate stage diagrams for explaining a method for manufacturing the semiconductor device according to some example embodiments of the present inventive concepts.

Referring to FIG. 22, a lower interlayer insulating film 410 including the lower pattern 405, an etching stop film 415, and a second interlayer insulating film 420 are sequentially formed on the substrate 100.

Subsequently, a hard mask film 430 and an upper mask film 440 are sequentially formed on the second interlayer insulating film 420.

The lower pattern 405 may include, for example, a conductive material. The etching stop film 415 may serve as a capping film which protects the lower pattern 405. The etching stop film 415 may include, for example, silicon nitride, silicon oxynitride, silicon carbonitride, and the like.

The second interlayer insulating film 420 may include, for example, at least one of silicon oxide, silicon nitride, silicon oxynitride, organo-silicate glass, organic material, inorganic material, a low-dielectric constant material or an ultra low-dielectric constant material.

The hard mask film 430 may include at least one of titanium nitride, titanium, titanium oxide, tungsten, tungsten nitride, tungsten oxide, tantalum, tantalum nitride, and tantalum oxide.

The upper mask film 440 may include, for example, at least one of silicon oxide, silicon nitride, and silicon oxynitride.

Figure 23:
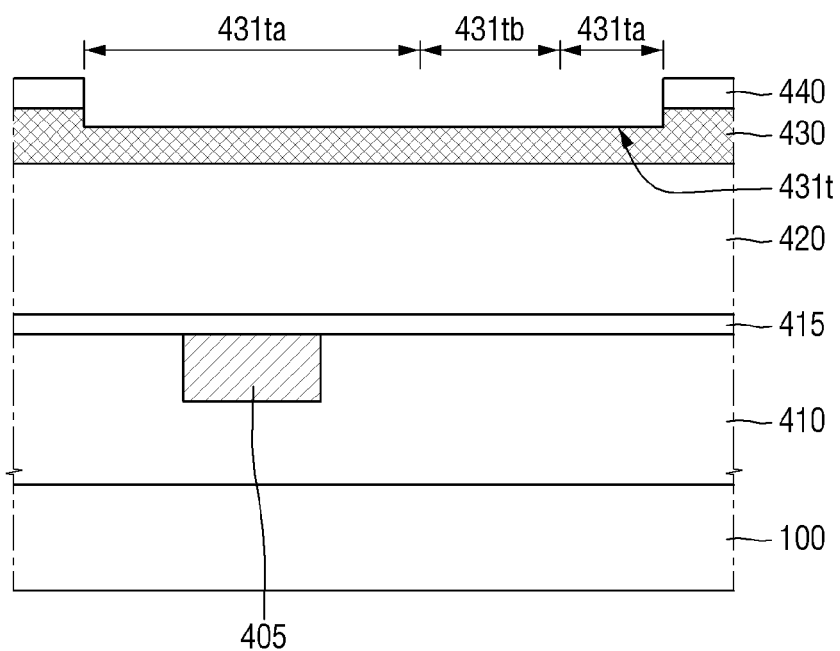

Referring to FIG. 23, a first trench 431t is formed in the hard mask film 430. The first trench 431t may be formed by removing a part of the hard mask film 430.

The first trench 431t may include a first portion 431ta and a second portion 431tb.

Figure 24:
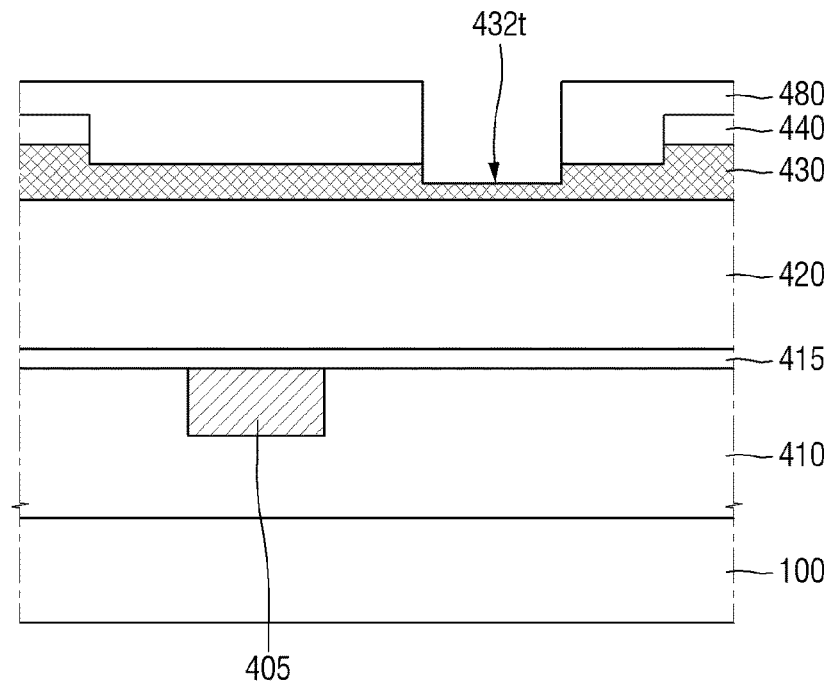
Figure 25:
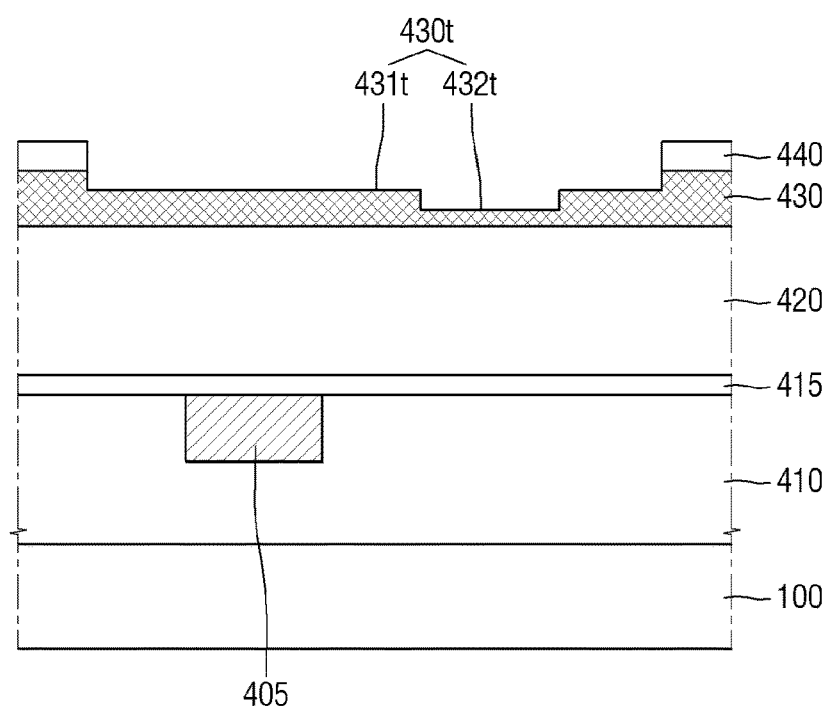

Referring to FIGS. 24 and 25, a first mask pattern 480 exposing the second portion 431tb of the first trench is formed on the hard mask film 430 and the upper mask film 440.

A part of the exposed hard mask film 430 may be removed, using the first mask pattern 480. A second trench 432t may be formed in the hard mask film 430 through an etching process using the first mask pattern 480.

A pattern trench 430t may be formed in the hard mask film 430 by removing the first mask pattern 480. The pattern trench 430t may include a second trench 432t and a first portion 431ta of the first trench.

Figure 26:
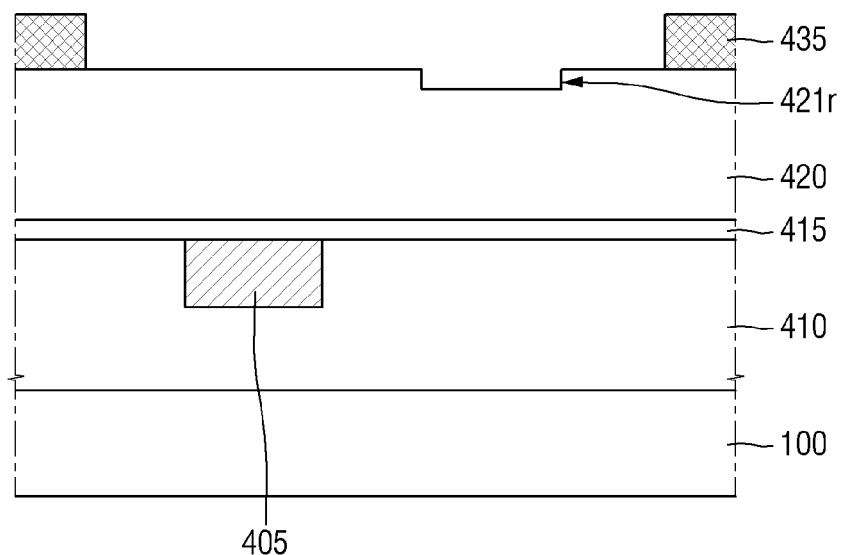

Referring to FIG. 26, the hard mask film 430 is etched to expose the second interlayer insulating film 420 which overlaps the pattern trench 430t.

A hard mask pattern 435 may be formed on the second interlayer insulating film 420 through an etching process for exposing the second interlayer insulating film 420.

The upper mask film 440 is illustrated as being removed while the hard mask pattern 435 is formed, but it is not limited thereto.

While the hard mask pattern 435 is formed, the first recess 421r may be formed in the second interlayer insulating film 420. The first recess 421r may be formed at a position corresponding to the second trench 432t. The second interlayer insulating film 420 corresponding to the second trench 432t may be etched further than the second interlayer insulating film 420 corresponding to the first portion 431ta of the first trench to form the first recess 421r.

Figure 27:
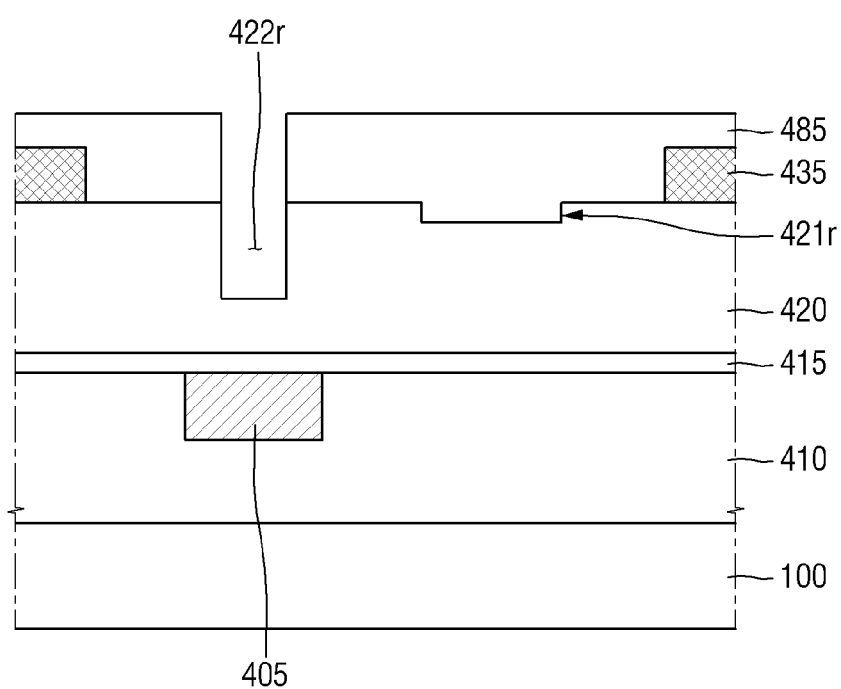
Figure 28:
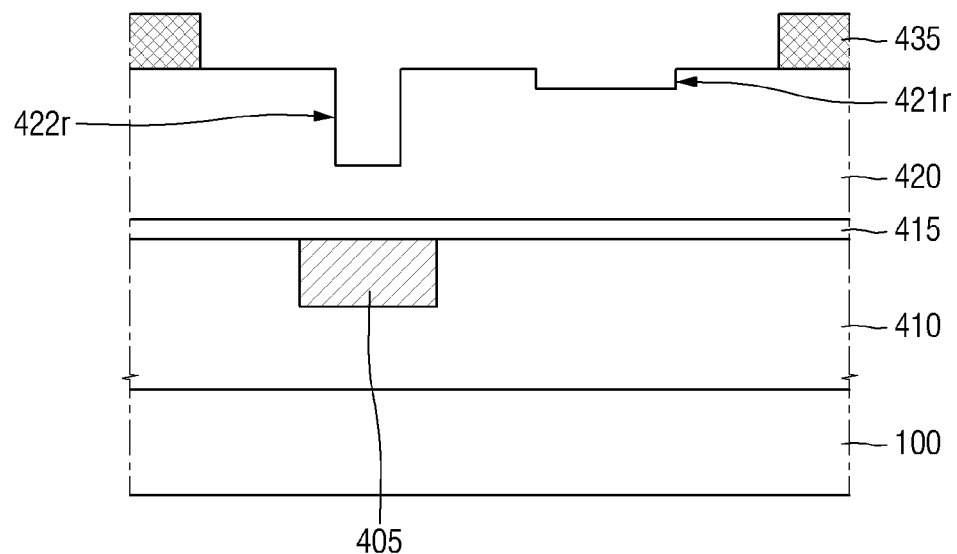

Referring to FIGS. 27 and 28, a second mask pattern 485 for exposing a part of the second interlayer insulating film 420 may be formed on the hard mask pattern 435.

The second recess portion 422r may be formed in the second interlayer insulating film 420, using the second mask pattern 485.

The depth of the second recess 422r may be deeper than the depth of the first recess 421r.

Subsequently, the second mask pattern 485 is removed.

Figure 29:
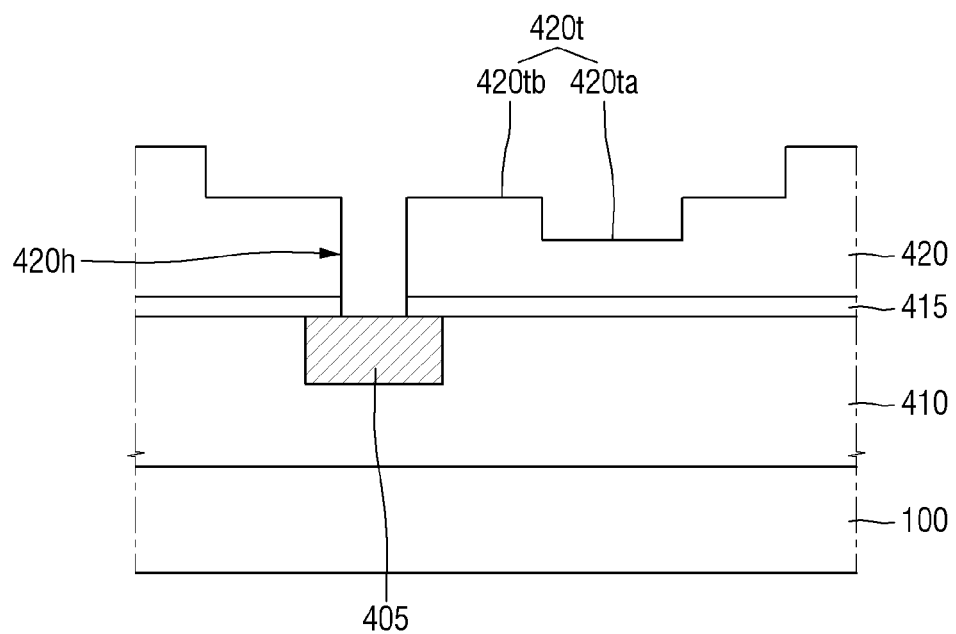

Referring to FIG. 29, the second interlayer insulating film 420 may be etched, using the hard mask pattern 435.

A wiring trench 420t and a via hole 420h may be formed in the second interlayer insulating film 420, by an etching process using the hard mask pattern 435.

The via hole 420h may expose the lower pattern 405. The via hole 420h may be formed at a position corresponding to the second recess 422r.

The wiring trench 420t may include a first portion 420ta and a second portion 420tb. The first portion 420ta of the wiring trench may be formed at a position corresponding to the first recess 421r. The second portion 420tb of the wiring trench may be formed at a position corresponding to the first portion (431ta of FIG. 23) of the first trench.

The depth of the first portion 420ta of the wiring trench is deeper than the depth of the second portion 420tb of the wiring trench.

Figure 30:
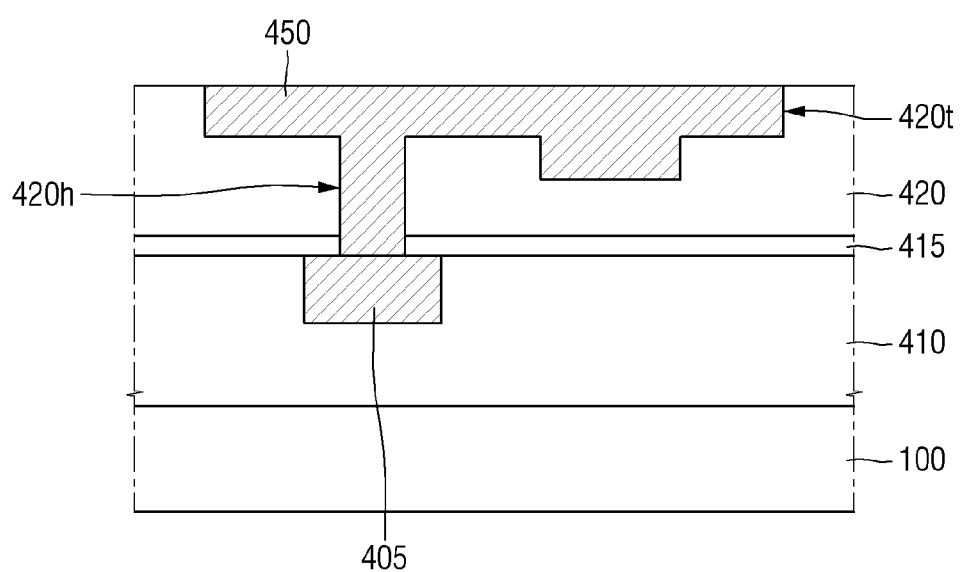

Referring to FIG. 30, the connection wiring 450 may be formed in the wiring trench 420t and the via hole 420h.

The connection wiring 450 is connected to the lower pattern 405, and the connection wiring 450 includes a conductive substance.

In concluding the detailed description, those skilled in the art will appreciate that many variations and modifications can be made to the example embodiments without substantially departing from the principles of the present inventive concepts. Therefore, the disclosed example embodiments of the inventive concepts are used in a generic and descriptive sense only and not for purposes of limitation.

What is claimed is:

1. A semiconductor device comprising:
a substrate including an active circuit region and a boundary region surrounding the active circuit region, the boundary region including an edge portion of the substrate;
a first lower conductive pattern on the substrate of the boundary region;
a first upper conductive pattern connected to the first lower conductive pattern over the first lower conductive pattern; and
a second upper conductive pattern spaced apart from the first upper conductive pattern at the same metal level of the first upper conductive pattern, on the substrate of the boundary region,
wherein the first upper conductive pattern includes a first portion having a first thickness, a second portion having a second thickness greater than the first thickness, and a third portion having a third thickness greater than the second thickness,
the third portion of the first upper conductive pattern is connected to the first lower conductive pattern, and
the second upper conductive pattern includes a fourth portion having a fourth thickness substantially the same as the second thickness and a fifth portion having a fifth thickness substantially the same as the third thickness.

2. The semiconductor device of claim 1, wherein the first portion of the first upper conductive pattern is between the second portion of the first upper conductive pattern and the third portion of the first upper conductive pattern.

3. The semiconductor device of claim 1, wherein the first upper conductive pattern further includes a sixth portion having a sixth thickness which is greater than the first thickness and smaller than the third thickness.

4. The semiconductor device of claim 3, wherein the second thickness is substantially the same as the sixth thickness.

5. The semiconductor device of claim 1, wherein the first lower conductive pattern includes a seventh portion having a seventh thickness, and an eighth portion having an eighth thickness greater than the seventh thickness, and the eighth portion of the first lower conductive pattern is connected to a conductive material below the first lower conductive pattern.

6. The semiconductor device of claim 5, wherein the first lower conductive pattern includes a ninth portion which has a ninth thickness which is greater than the seventh thickness and smaller than the eighth thickness, and the seventh portion of the first lower conductive pattern is between the eighth portion of the first lower conductive pattern and the ninth portion of the first lower conductive pattern.

7. The semiconductor device of claim 1, further comprising:

a fin type pattern, and a gate electrode on the fin type pattern, in the active circuit region, wherein a height from the substrate to an upper surface of the gate electrode is smaller than a height from the substrate to the first lower conductive pattern.

8. The semiconductor device of claim 1, wherein the third portion of the first upper conductive pattern is in contact with the first lower conductive pattern.

9. A semiconductor device comprising:

a substrate including an active circuit region and a boundary region surrounding the active circuit region;

a first fin type pattern on the substrate of the active circuit region;

a gate electrode on the first fin type pattern;

a pre-metal insulating layer on the first fin type pattern and the gate electrode;

a first lower conductive pattern and a second lower conductive pattern at a first metal level on the pre-metal insulating layer and apart from each other, in the boundary region;

a first upper conductive pattern at a second metal level higher than the first metal level and connected to the first lower conductive pattern; and a second upper conductive pattern at the second metal level, apart from the first upper conductive pattern, and connected to the second lower conductive pattern, wherein the first upper conductive pattern includes a first portion having a first thickness, a second portion having a second thickness greater than the first thickness, and a third portion having a third thickness greater than the second thickness, the first portion of the first upper conductive pattern is between the second portion of the first upper conductive pattern and the third portion of the first upper conductive pattern, and the second upper conductive pattern includes a fourth portion having a fourth thickness substantially the same as the second thickness and a fifth portion having a fifth thickness substantially the same as the third thickness.

10. The semiconductor device of claim 9, wherein the third portion of the first upper conductive pattern is in contact with the first lower conductive pattern.

11. The semiconductor device of claim 9, wherein the fifth portion of the second upper conductive pattern is in contact with the second lower conductive pattern.

12. The semiconductor device of claim 9, further comprising:

a pair of second fin type patterns on the substrate of the boundary region; and a conductive plug between the second fin type patterns and connected to the first lower conductive pattern.

13. The semiconductor device of claim 9, further comprising:

a wiring structure on the pre-metal insulating layer and connected to the gate electrode, in the active circuit region, wherein the wiring structure is at the first metal level and the second metal level.

14. A semiconductor device comprising:

a substrate including an active circuit region, and a boundary region surrounding the active circuit region, the boundary region including an edge portion of the substrate; and a first conductive guard structure and a second conductive guard structure spaced apart from the first conductive guard structure surrounding the active circuit region on the substrate of the boundary region, wherein the first conductive guard structure includes a first plate pattern, a second plate pattern on the first plate pattern, and a via pattern for connecting the first plate pattern and the second plate pattern, the second plate pattern is apart from the first plate pattern, the second plate pattern includes a first portion having a first thickness, and a second portion having a second thickness greater than the first thickness, the second conductive guard structure includes a third plate pattern at the same metal level as the second plate pattern, and the third plate pattern includes a third portion having a third thickness substantially the same as the second thickness.

15. The semiconductor device of claim 14, wherein the second conductive guard structure is closer to the active circuit region than the first conductive guard structure.

* * * * *